(12) United States Patent
Sakurai et al.

(10) Patent No.: US 9,356,585 B2
(45) Date of Patent: May 31, 2016

(54) IMAGE PICKUP DEVICE

(71) Applicant: CANON KABUSHIKI KAISHA, Tokyo (JP)

(72) Inventors: Katsuhito Sakurai, Machida (JP); Itsutaku Sano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 13/711,414

(22) Filed: Dec. 11, 2012

(65) Prior Publication Data

US 2013/0154705 A1 Jun. 20, 2013

(30) Foreign Application Priority Data

Dec. 15, 2011 (JP) ................. 2011-274890
Sep. 19, 2012 (JP) ................. 2012-205581

(51) Int. Cl.
| H03K 3/00 | (2006.01) |
| H03K 3/86 | (2006.01) |
| H03K 4/02 | (2006.01) |
| H03K 5/24 | (2006.01) |
| H04N 5/378 | (2011.01) |
| H01L 27/146 | (2006.01) |

(52) U.S. Cl.
CPC .............. *H03K 3/86* (2013.01); *H01L 27/1464* (2013.01); *H01L 27/14603* (2013.01); *H01L 27/14609* (2013.01); *H03K 4/026* (2013.01); *H03K 5/2472* (2013.01); *H04N 5/378* (2013.01)

(58) Field of Classification Search
USPC .......................................................... 327/53
See application file for complete search history.

(56) References Cited

U.S. PATENT DOCUMENTS

| 6,184,752 | B1 * | 2/2001 | Dautriche ..................... 330/278 |
| 6,339,215 | B1 * | 1/2002 | Yonemoto et al. ......... 250/208.1 |
| 6,518,910 | B2 | 2/2003 | Sakuragi |
| 7,068,312 | B2 | 6/2006 | Kakumoto |
| 7,091,978 | B2 | 8/2006 | Yoshimura |
| 7,542,086 | B2 | 6/2009 | Hagihara |
| 7,636,116 | B2 * | 12/2009 | Hashimoto .................. 348/294 |
| 2001/0012070 | A1 | 8/2001 | Enod et al. |
| 2001/0020909 | A1 | 9/2001 | Sakuragi et al. |
| 2005/0259099 | A1 | 11/2005 | Jo et al. |

(Continued)

FOREIGN PATENT DOCUMENTS

| JP | 2001-069404 A | 3/2001 |
| JP | 2001-157114 A | 6/2001 |

(Continued)

OTHER PUBLICATIONS

U.S. Appl. No. 13/711,467, filed Dec. 11, 2012, Katsuhito Sakurai.

*Primary Examiner* — Lincoln Donovan
*Assistant Examiner* — Patrick Chen
(74) *Attorney, Agent, or Firm* — Canon USA, Inc. IP Division

(57) ABSTRACT

An electronic device according to one or more embodiments of the present invention comprises an output line, a current mirror circuit and a comparator. Current signals from a plurality of signal sources are output to the output line. The current mirror circuit is electrically connected to the output line. The comparator is configured to compare a mirrored current signal from the current mirror circuit with a reference current signal. The comparator is configured to output a signal representing a comparison result of amplitudes of the mirrored current signal and the reference current signal.

19 Claims, 16 Drawing Sheets

(56) References Cited

U.S. PATENT DOCUMENTS

| | | |
|---|---|---|
| 2007/0008015 A1* | 1/2007 | Hershbarger .................. 327/53 |
| 2007/0205814 A1* | 9/2007 | Chatal et al. .................. 327/112 |
| 2007/0236590 A1 | 10/2007 | Harris |
| 2009/0027372 A1* | 1/2009 | Shishido et al. .............. 345/207 |
| 2009/0072120 A1 | 3/2009 | McGarry et al. |
| 2009/0231478 A1 | 9/2009 | Shinohara |
| 2010/0291870 A1* | 11/2010 | Butler ......................... 455/41.1 |
| 2010/0321072 A1* | 12/2010 | Bauwelinck et al. ......... 327/142 |
| 2011/0141324 A1* | 6/2011 | Koseki .......................... 348/241 |
| 2012/0133539 A1* | 5/2012 | Hales .................... H03K 5/2472 341/159 |

FOREIGN PATENT DOCUMENTS

| | | |
|---|---|---|
| JP | 2001-223566 A | 8/2001 |
| JP | 2003-259228 A | 9/2003 |
| JP | 2004-023135 A | 1/2004 |
| JP | 2008-060872 A | 3/2008 |
| JP | 2008-141609 A | 6/2008 |

* cited by examiner

IMAGE PICKUP DEVICE

BACKGROUND OF THE INVENTION

1. Field of the Invention

The disclosure relates to an image pickup device and, in particular, to an image pickup device comprising a comparator configured to compare current signals.

2. Description of the Related Art

In recent years, an electronic device comprising a comparator which compares a current signal selectively output from a plurality of signal sources with another current signal (which may be a reference current signal) and outputs a voltage signal based on the comparison of the current signals has been developed.

Japanese Patent Laid-Open No. 2001-346102 describes a solid-state image pickup device having a comparator for comparing current signals from first and second transistors, whereby converting analog signals from pixels into digital signals.

Japanese Patent Laid-Open No. 2001-292379 describes a signal processing device for obtaining differential information in image frames. The signal processing device has a plurality of memory units and an operation unit for comparing current signals from the memory units.

SUMMARY OF THE INVENTION

An electronic device according to one or more embodiments of the present invention comprises an output line, a current mirror circuit and a comparator. Current signals from a plurality of signal sources are output to the output line. The current mirror circuit is electrically connected to the output line. The comparator is configured to compare a mirrored current signal from the current mirror circuit with a reference current signal. The comparator is configured to output a signal representing a comparison result of amplitudes of the mirrored current signal and the reference current signal.

An electronic device according to one or more embodiments of the present invention comprises an output line, an impedance conversion portion and a comparator. Current signals from a plurality of signal sources are output to the output line. The impedance conversion portion is electrically connected to the output line. The comparator is configured to compare a current signal from the impedance conversion portion with a reference current signal. The comparator is configured to output a signal representing a comparison result of amplitudes of the current signal from the impedance conversion portion and the reference current signal.

Further features of the present invention will become apparent from the following description of exemplary embodiments with reference to the attached drawings.

DESCRIPTION OF THE EMBODIMENTS

Figure 1:
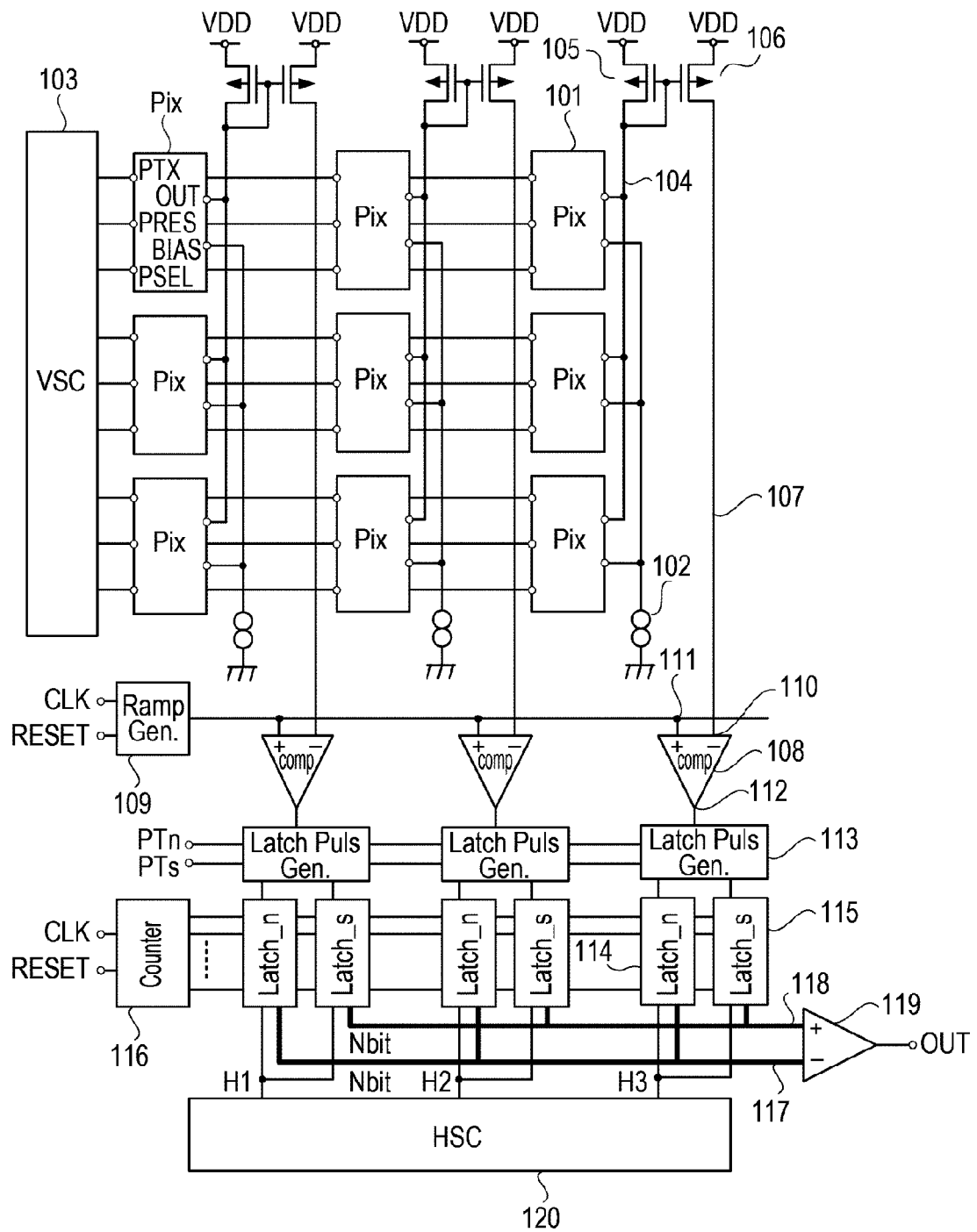
FIG. 1 illustrates an equivalent circuit of a first exemplary embodiment.

An electronic device according to one or more embodiments of the invention may be included in a photoelectric conversion device. The embodiment of the electronic device comprises an output line, a current mirror circuit electrically connected to the output line and a comparator for comparing at least two current signals. A plurality of pixels are electrically connected to the output line so as to respectively output current signals into the output line. The current mirror circuit mirrors (or reflects) the current signal from the pixel and outputs a mirrored current signal. The comparator outputs, to an output node of the comparator, a signal representing the amplitude relationship between the current signals which are input to the comparator.

In one or more embodiments, the mirrored current signal, which the current mirror circuit is outputting, is compared with a reference current signal. The reference current signal may be a reference for comparison. Specifically, the electronic device according to one or more embodiments includes a comparator to which the mirrored current signal that the current mirror circuit is outputting and the reference signal are input.

In the current mirror circuit, a path of an input current and a path of an output current may be separated from each other. The current mirror circuit may amplify or attenuate the input current and output an amplified or attenuated current as an output current. The output current from the current mirror circuit may be the mirrored current signal.

A period during which the comparator outputs the mirrored current signal may overlap with a period during which the input current is input to the comparator. By simultaneously inputting and outputting the current signals, the mirroring operation may be conducted at a high speed. The comparator may output the mirrored current signal when the input current signal is not input.

A signal source may output a current signal. A memory, a node via which a current signal is input from outside and a sensor are enumerated as exemplary signal sources. The pixel is a sensor for detecting light and may be the signal source. The pixel includes a photoelectric conversion unit and outputs a current signal corresponding to the amount of charges generated by the photoelectric conversion unit. Further, a heat sensor, a pressure sensor and an electromagnetic sensor are enumerated as exemplary sensors.

According to one or more embodiments of the present invention, current signals may be compared within a short time. In one or more embodiments, the mirrored current signal, which the current mirror circuit is outputting, is compared with a reference current signal. According to one or more embodiments, it may be possible to compare the current signal from each of the signal sources with the reference current signal even though those signal sources are not connected to the comparator, especially the output node of the comparator. Therefore, a conductive member included in the output node may be arranged regardless of the arrangement or the configuration of the signal sources. In another case, the number of the transistors which are connected to the output node may be determined regardless of the number of the signal sources. In other words, it may be possible to reduce the parasitic capacitance of the output node, where a voltage signal representing a result of the comparison may be output. Hence, the voltage signal representing the result of the comparison may be quickly output because the speed of voltage change at the output node may be improved.

A device described below has been known to the inventors. A plurality of P-type channel amplification MOS (Metal Oxide Semiconductor) transistors are connected to a signal line via respective selection transistors. Further, a current mirror circuit is connected to the signal line. The current mirror circuit outputs a reference current signal. At the signal line, a current signal from a selected one of the amplification MOS transistors and the reference current signal from current mirror circuit are compared. Then, at the signal line, a voltage signal, corresponding to the amplitude relationship of the current signal from the amplification MOS transistor and the reference signal, emerges.

Another device described below has been known to the inventors. Memory gate transistors included in the memory units are connected to a signal line which has a node IM. Two current signals from two of the memory units are sequentially output to the signal line. Then, a voltage at the signal line varies according to the amplitude relationship of the two current signals. According to a direction toward which the voltage varies, the operation unit makes decision on which one of the two current signals has larger amplitude than the other.

The inventors have noted that, in the electronic devices known to the inventors, a plurality of signals sources are connected to an output node (a signal line), where a voltage signal representing a result of the comparison may be output. In other words, a large number of transistors are connected to the output node, in which the voltage may vary. Therefore, a parasitic capacitance of the output node may be large. A larger capacitance of the output node may cause a large time constant. Thus, it may take a long time to accurately compare current signals.

Since the improvement in speed may be obtained by the arrangement of the conductive member included in the output node, the number of the transistors which are connected to the output node is not limited. When the number of the transistors which are connected to the output node is lower than the number of the signal sources, the speed may be more improved than otherwise. Two transistors may be connected to the output node: one outputs the current signals from the signal sources, and the other outputs the reference current signal. The output node may be electrically connected to a transistor included in a circuit of the subsequent stage.

In case the electronic device according to one or more embodiments is included in a photoelectric conversion device, the improvement in speed is beneficial. In this case, the signal source may be the pixel. The photoelectric conversion device may be used in cameras, which generally uses a large number of pixels for obtaining an improved image quality. For example, the photoelectric conversion device may include millions of pixels or more. Further, in the photoelectric conversion device, the pixels may be arranged in matrix, and signals from a plurality of the pixels may be output to a common signal line. Thus, the more pixels are provided, the more pixels may be connected to the same common signal line. In other words, the parasitic capacitance of the signal line is apt to be large. Hence, it may be beneficial to reduce the parasitic capacitance of the output node of the comparator.

In the following detailed description, for purposes of explanation, numerous specific details are set forth in order to provide a thorough understanding of the disclosed embodiments. These embodiments may have the above mentioned features. It will be apparent, however, that one or more embodiments may be practiced without these specific details. In other instances, well-known structures and devices are schematically shown in order to simplify the drawing.

In the following embodiments, an electron is used as a signal charge. In other embodiments, a hole may be used as a signal charge, and the conductivity type of the elements may be inverted.

First Exemplary Embodiment

FIG. 1 illustrates an equivalent circuit of a photoelectric conversion device according to one or more embodiments. The photoelectric conversion device of the present embodiment of the invention includes a plurality of pixels, a current mirror circuit, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which is output from the pixel as an analog signal, into a digital signal. According to drive signals the horizontal scanning circuit provides, the digital signal is read out to the output portion. The output portion outputs the digital signal to the outside of the device.

The A-D convertor includes a comparator, a latch pulse generator, a memory and a counter. The current signals from the pixels are converted into the digital signals at respective pixel columns. The comparator compares the current signal from the pixel with a ramp current signal. The comparator outputs a pulse based on a timing of an inversion of the amplitude relationship between the current signal from the pixel and the ramp current signal. According to the pulse the comparator outputs, the latch pulse generator input a latch pulse to a latch circuit of the memory. The memory stores a count value that the counter is outputting when the latch pulse is input to the memory. The count value stored in memory is the digital signal converted from the current signal.

In the present embodiment, at each pixel column, the current signal is converted into the digital signal. Further, in the present embodiment, the current signal from the pixel is mirrored by the current mirror circuit, and a mirrored current signal is input to the comparator for comparing with the ramp current signal.

Each part of the photoelectric conversion device of the present embodiment will be described in detail. The plurality of pixels 101 are arranged so as to form a pixel array including three rows and three columns. The number of the pixels 101 is not limited. For example, the plurality of pixels 101 are arranged so as to form a pixel array including more than 1000 rows and more than 1500 columns. In another case, the plurality of pixels 101 may be arranged in a line so as to form a line sensor.

Signals from the pixels 101 included in a single pixel column may be processed in common circuitry. In the following description, exemplary one of the pixel columns will be explained. The other pixel columns may have the same structure, configuration and/or circuitry as the exemplary one.

The pixel 101 includes at least a photoelectric conversion unit and a pixel amplification unit. Incident light may be converted into a charge by the photoelectric conversion unit. The pixel amplification unit may output a current signal corresponding to the amount of charges generated by the photoelectric conversion unit. Thus, the pixel 101 may be a signal source configured to output a current signal. The pixel 101 includes OUT node, via which the current signal from the pixel 101 is output. The pixel 101 may further include a BIAS node, via which a bias current is provided from a bias current source, and a plurality of nodes (PTX node, PRES node and PSEL node), via which drive signals are provided. The detailed structure of the pixel 101 will be described later.

The BIAS node of the pixel 101 is electrically connected to the bias current source 102. A plurality of the pixel 101 may be electrically connected to the common bias current source 102. For example, the pixels 101 included in a single pixel column are electrically connected to the common bias current source 102. In another case, a bias current source 102 may be provided for each of the pixels 101 in the pixel column.

The PTX node, the PRES node and the PSEL node are electrically connected to the vertical scanning circuit 103. The vertical scanning circuit 103 may provide a common drive signal for the pixels 101 included in a single pixel row. Further, the vertical scanning circuit 103 may provide the pixels included in different rows from each other with independent drive signals. According to the drive signals the vertical scanning circuit provides, the signals are read out from the pixels 101 on the pixel row basis.

The OUT node of the pixel 101 is electrically connected to a first output line 104. The OUT nodes of a plurality of the pixels 101 may be electrically connected to the common first output line 104. For example, the OUT nodes of the pixels 101 included in a single pixel column are electrically connected to the common first output line 104. Thus, the current signals from the plurality of the pixels 101 may be output to the first output line 104.

The first output line 104 is electrically connected to the current mirror circuit. An output node of the current mirror circuit is electrically connected to a second output line 107. The current mirror circuit includes an input-side transistor 105 and an output-side transistor 106. The input-side and output-side transistors 105, 106 are P-type channel MOS (Metal Oxide Semiconductor) transistors. The gate and the drain of the input-side transistor 105 are shorted. The source of the input-side transistor 105 is electrically connected to a power source line. The power source line may provide the source of the input-side transistor 105 with a power source voltage VDD. The gate of the output-side transistor 106 is electrically connected to the gate of the input-side transistor 105. The source of the output-side transistor 106 is electrically connected to a power source line. The power source line may provide the source of the output-side transistor 106 with a power source voltage VDD. The first output line 104 is electrically connected to the drain of the input-side transistor 105 and the gates which are shorted to the drain of the input-side transistor 105. The drain of the output-side transistor 106 is electrically connected to the second output line 107.

In the current mirror circuit, a current running through the input-side transistor 105 may be mirrored in the output-side transistor 106. In other words, the current mirror circuit may output a current signal (a mirrored current signal) corresponding to the current signal at the first output line 104 into the second output line 107. The current mirror circuit may output the mirror current signal which is amplified or attenuated with respected to the current signal at the first output line 104. The amplification (or attenuation) factor may be determined according to a ratio of the sizes of the input and output-side transistors 105, 106. For example, in a case of the input and output-side transistors 105, 106 having the substantially same channel length, the amplification (or attenuation) factor may be the ratio of the channel widths.

The current signal at the second output line 107 is input to the A-D convertor, and converted into a digital signal. The A-D convertor includes a comparator 108. The comparator 108 has a signal input node 110, a reference current input node 111 and output node 112. The second output line 107 is electrically connected to the signal input node 110. The reference current input node 111 of the comparator 108 is electrically connected to a ramp current signal source 109.

The comparator 108 may compare the current signal input to the signal input node 110 with a ramp current signal, which is the reference current signal, and output a voltage signal corresponding to the amplitude relationship of the current signals. In detail, the comparator 108 may output a first voltage when the current signal from the pixel 101 is larger than the ramp current signal. The comparator 108 may output a second voltage, which is different from the first voltage, when the ramp current signal is larger than the current signal from the pixel 101. For example, the first voltage may be near the ground voltage GND, and the second voltage near the power source VDD, or vice versa. The detailed structure of the comparator 108 will be described later.

The ramp current signal source 109 outputs the ramp current signal, whose amplitude may be continuously variable. In another case, the ramp current signal source 109 outputs the ramp current signal, whose amplitude may vary step-by-step according to a clock signal CLK. The ramp current signal source 109 is provided with a ramp reset signal via a reset node. According to the ramp reset signal, the ramp current signal is reset to an initial value. The detailed structure of the ramp current signal source 108 will be described later.

The A-D convertor of the present embodiment includes a latch pulse generator 113, memory (N latch circuit 114 and S latch circuit 115) and a counter 116. The output node 112 of the comparator 108 is electrically connected to the latch pulse generator 113. The latch pulse generator 113 may be provided with drive signals PTN and PTS. According to the drive signals PTN and PTS, a node to which the latch pulse is output may be selected. The latch pulse generator 113 outputs a latch pulse selectively into N latch circuit 114 or into S latch circuit 115 based on a timing of an inversion of the voltage signal the comparator 108 outputs.

The N latch circuit 114 and the S latch circuit 115 are provided with count value from the counter 116. When the latch pulse is input, the N latch circuit 114 and the S latch circuit 115 may store the count value the counter 116 is outputting at the time.

The counter 116 counts up or down and outputs the count value according to the clock signal CLK. When a counter reset signal is provided via a reset node of the counter 116, the count value is reset to an initial value. The count value corresponding to the amplitude of the current signal may be stored in the latch circuit by synchronized drive signals provided for the ramp current signal source 109 and the counter 116. Thus, the current signal is converted into a digital signal.

The memory (the N latch circuit 114 and the S latch circuit 115) is electrically connected to an output portion. In detail, the N latch circuit 114 is connected to an output circuit 119 via a third output line 117, and the S latch circuit 115 is connected to the output circuit 119 via the fourth output line 118.

The horizontal scanning circuit 120 provides each of the latch circuits 114, 115 with a drive signal. According to the drive signal from the horizontal scanning circuit 120, each of the latch circuits 114, 115 outputs the stored count value as the digital signal into the output circuit 119.

The output circuit 119 may include LVDS (Low Voltage Differential Signaling) circuit. Additionally, the output circuit 119 may digitally process the digital signals from the latch circuits 114, 115. For example, the output circuit may output differential between the digital signal of the S latch circuit 114 and the digital signal of the N latch circuit 115.

As described above, a signal from the pixel, which is a signal source, is converted into a digital signal and is output to the outside of the photoelectric conversion device.

Hereinafter, an exemplary structure of the pixel 101 will be described in detail. The pixel 101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 2:
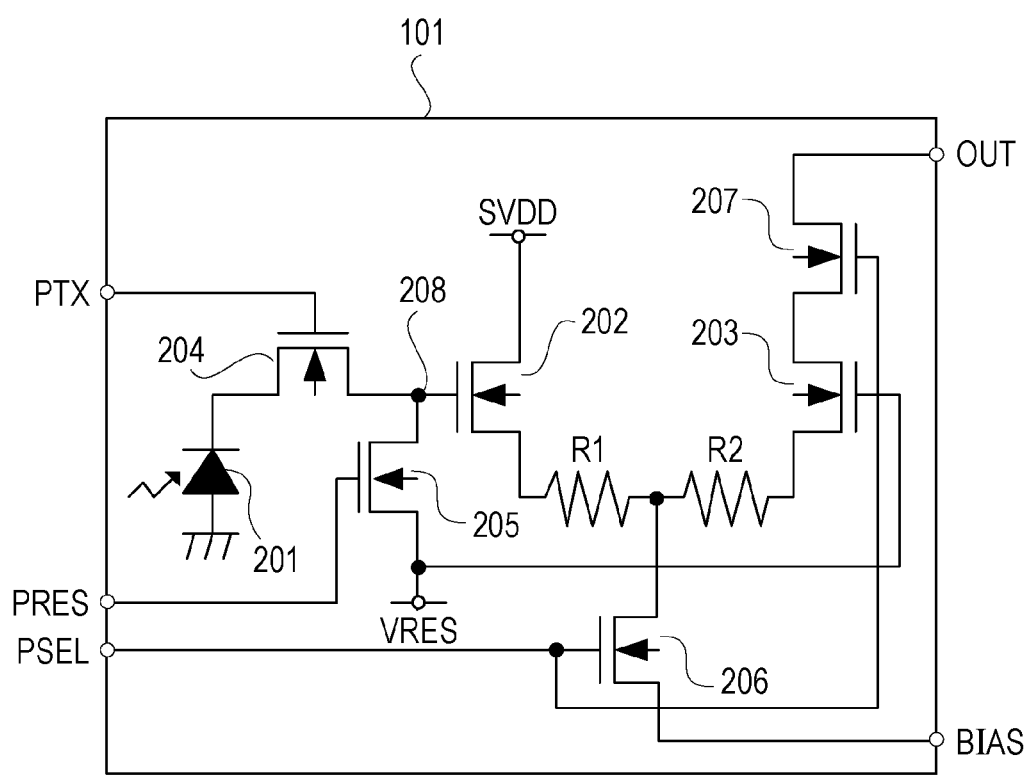
FIG. 2 illustrates an equivalent circuit of an exemplary pixel of an exemplary embodiment.

FIG. 2 illustrates an equivalent circuit of the pixel 101 according to one or more embodiments. The photoelectric conversion unit may be, for example, a photodiode (below, PD) 201. The pixel amplification unit may be, for example, a differential amplifier. The differential amplifier includes a first input transistor 202 and a second input transistor 203. The pixel 101 may include a transfer transistor 204, a reset transistor 205, a first selection transistor 206, a second selection transistor 207, a resistor R1 and a resistor R2.

The anode of the PD 201 is provided with a ground voltage GND. The cathode of the PD 201 is electrically connected to a node 208 via the transfer transistor 204. The transfer transistor 204 transfers the charges generated at the PD 201 to the node 208.

The gate of the first input transistor 202 is electrically connected to the node 208. The gate of the first input transistor 202 is a first input node of the differential amplifier. The voltage at the gate of the first input transistor 202 may be a voltage corresponding to the amount of charges which are transferred to the node 208. In another aspect, the transferred charges are converted into a voltage signal at the node 208. The drain of the first input transistor 202 is electrically connected to the power source line. The power source line may provide the drain of the first input transistor 202 with a power source voltage SVDD. The power source voltage SVDD may be the same as the power source voltage VDD which provided for the current mirror circuit. In another case, the power source voltage SVDD and the power source voltage VDD may be different from each other. The source of the first input transistor 202 is electrically connected to the drain of the first selection transistor 206 via the resistor R1.

The gate of the second input transistor 203 is electrically connected to a reset voltage line. The gate of the second input transistor 203 is a second input node of the differential amplifier. The reset voltage line may provide the gate of the second input transistor 203 with a reset voltage VRES. The source of the second input transistor 203 is electrically connected to the drain of the first selection transistor 206 via the resistor R2. The drain of the second input transistor 203 is electrically connected to the source of the second selection transistor 207.

The node 208 is electrically connected to the reset voltage line via the reset transistor 205. When the reset transistor 205 is turned on, the node 208 is provided with the reset voltage VRES. In other words, the reset transistor 205 may reset the voltage of the first input node of the differential amplifier.

The drain of the first selection transistor 206 is electrically connected to the resistor R1 and the resistor R2. The source of the first selection transistor 206 is electrically connected to the BIAS node. The drain of the second selection transistor 207 is electrically connected to the OUT node. The BIAS node is electrically connected to the bias current source 102 and the OUT node is electrically connected to the first output line 104.

The gate of the transfer transistor 204 is electrically connected to the PTX node. The gate of the reset transistor 205 is electrically connected to the PRES node. The gates of the first and second selection transistors 206, 207 are electrically connected to the PSEL node. The vertical scanning circuit 103 provides each gate of the transistors with a drive signal for controlling each of the transistors to be turned on or off.

The first input transistor 202 and the second input transistor 203 may form a differential pair. That is, the sources of the two transistors 202, 203 are electrically connected to the common bias current source 102. A drain current of the second input transistor 203, which is the current signal to be output from the pixel 101, corresponds to the difference of the voltages at the gates of the two transistors 202, 203. Thus, the differential pair of the first input transistor 202 and the second input transistor 203 is included in the differential amplifier.

The first and second selection transistors 206, 207 may select a pixel 101 which outputs the current signal, out of the plurality of the pixels 101. In detail, when both of the first and second selection transistors 206, 207 are on, the differential amplifier may output the current signal via the OUT node.

In FIG. 2, the first and second selection transistors 206, 207 are provided for selection of the pixel. Providing the first selection transistor 206 may reduce power consumption by cutting the current when the pixel is in a non-selective state. Providing the second selection transistor 207 may reduce the parasitic capacitance of the first output line 104.

One of the first and second selection transistors 206, 207 may be omitted. In case the second selection transistor 207 is omitted, accuracy of the current signal may be improved because the symmetrical characteristic of the differential amplifier may be improved.

Further, a third selection transistor may be provided in an electrical path between the drain of the first input transistor 202 and the power source line. In case both of the second and third selection transistors are provided, accuracy of the current signal may be improved because the symmetrical characteristic of the differential amplifier may be improved.

In another case, both of the first and second selection transistors 206, 207 may be omitted. In this case, the pixel 101 may be set in non-selective state by providing the gate of the first and second input transistors 202, 203 with a voltage such that the both transistors 202, 203 are turned off. For example, such voltage may be provided from the reset voltage line. In case both of the first and second selection transistors 206, 207 are omitted, the fill factor of the pixel may be improved by reduction of the number of the pixel transistors.

The transfer transistor 204 may be provided in one or more embodiments. In other embodiments, the transfer transistor 204 may be omitted. In case the transfer transistor 204 is omitted, the fill factor of the pixel may be improved by reduction of the number of the pixel transistors.

Hereinafter, another exemplary structure of the pixel 101 will be described in detail. The pixel 101 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 3:
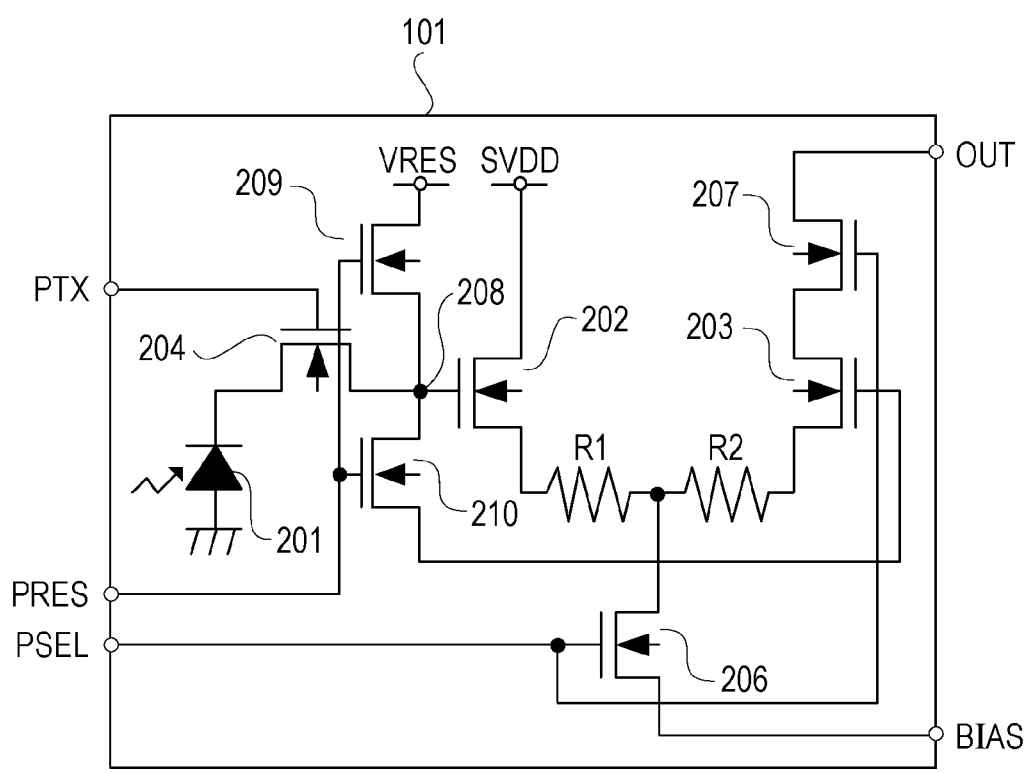
FIG. 3 illustrates an equivalent circuit of an exemplary pixel of an exemplary embodiment.

FIG. 3 illustrates an equivalent circuit of the pixel 101 according to one or more embodiments. The photoelectric conversion unit may be, for example, a photodiode (below, PD) 201. The pixel amplification unit may be, for example, a differential amplifier. The differential amplifier includes a first input transistor 202 and a second input transistor 203. The pixel 101 may include a transfer transistor 204, a reset transistor 209, a connection transistor 210, a first selection transistor 206, a second selection transistor 207, a resistor R1 and a resistor R2.

The anode of the PD 201 is provided with a ground voltage GND. The cathode of the PD 201 is electrically connected to a node 208 via the transfer transistor 204. The transfer transistor 204 transfers the charges generated at the PD 201 to the node 208.

The gate of the first input transistor 202 is electrically connected to the node 208. The gate of the first input transistor 202 is a first input node of the differential amplifier. The voltage at the gate of the first input transistor 202 may be a voltage corresponding to the amount of charges which are transferred to the node 208. In another aspect, the transferred charges are converted into a voltage signal at the node 208. The drain of the first input transistor 202 is electrically connected to the power source line. The power source line may provide the drain of the first input transistor 202 with a power source voltage SVDD. The power source voltage SVDD may be the same as the power source voltage VDD which provided for the current mirror circuit. In another case, the power source voltage SVDD and the power source voltage VDD may be different from each other. The source of the first input transistor 202 is electrically connected to the drain of the first selection transistor 206 via the resistor R1.

The gate of the second input transistor 203 is electrically connected to a source of the connection transistor 210. The gate of the second input transistor 203 is a second input node of the differential amplifier. The source of the second input transistor 203 is electrically connected to the drain of the first selection transistor 206 via the resistor R2. The drain of the second input transistor 203 is electrically connected to the source of the second selection transistor 207.

The node 208 is electrically connected to the reset voltage line via the reset transistor 209. When the reset transistor 209 is turned on, the node 208 is provided with the reset voltage VRES. In other words, the reset transistor 209 may reset the voltage of the first input node of the differential amplifier.

The connection transistor 210 is provided in an electrical path between the gate of the first input transistor 202 (the node 208) and the gate of the second input transistor 203. In other words, one of the source and the drain of the connection transistor 210 is electrically connected to the gate of the first input transistor 202 and the other to the gate of the second input transistor 203. When the connection transistor is turned on, the gate of the first input transistor 202 and the gate of the second input transistor 203 are shorted to each other. When both of the reset transistor 209 and the connection transistor 210 are turned on, the reset voltage VRES may be provided for the gate of the second input transistor 203 via the reset transistor 209 and the connection transistor 210.

The drain of the first selection transistor 206 is electrically connected to the resistor R1 and the resistor R2. The source of the first selection transistor 206 is electrically connected to the BIAS node. The drain of the second selection transistor 207 is electrically connected to the OUT node. The BIAS node is electrically connected to the bias current source 102 and the OUT node is electrically connected to the first output line 104.

The gate of the transfer transistor 204 is electrically connected to the PTX node. The gate of the reset transistor 209 and the gate of the connection transistor 210 are electrically connected to the PRES node. The gates of the first and second selection transistors 206, 207 are electrically connected to the PSEL node. The vertical scanning circuit 103 provides each gate of the transistors with a drive signal for controlling each of the transistors into on or off.

In FIG. 3, the gate of the reset transistor 209 and the gate of the connection transistor 210 are electrically connected to each other. In another case, the gate of the reset transistor 209 and the gate of the connection transistor 210 may be provided with independent drive signals. In this case the reset transistor 209 and the connection transistor 210 may be controlled independently from each other. For example, when the both of the reset transistor 209 and the connection transistor 210 are on, the reset transistor 209 is firstly turned off, thereafter the connection transistor 210 is turned off.

The first input transistor 202 and the second input transistor 203 may form a differential pair. That is, the sources of the two transistors 202, 203 are electrically connected to the common bias current source 102. A drain current of the second input transistor 203, which is the current signal to be output from the pixel 101, corresponds to the difference of the voltages at the gates of the two transistors 202, 203. Thus, the differential pair of the first input transistor 202 and the second input transistor 203 is included in the differential amplifier.

The first and second selection transistors 206, 207 may select a pixel 101 which outputs the current signal, out of the plurality of the pixels 101. In detail, when both of the first and second selection transistors 206, 207 are on, the differential amplifier may output the current signal via the OUT node.

In FIG. 3, a second reset transistor may be provided in an electrical path between the gate of the second input transistor 203 and the reset voltage line. In this case, accuracy of the current signal may be improved because the symmetrical characteristic of the differential amplifier may be improved.

Figure 4:
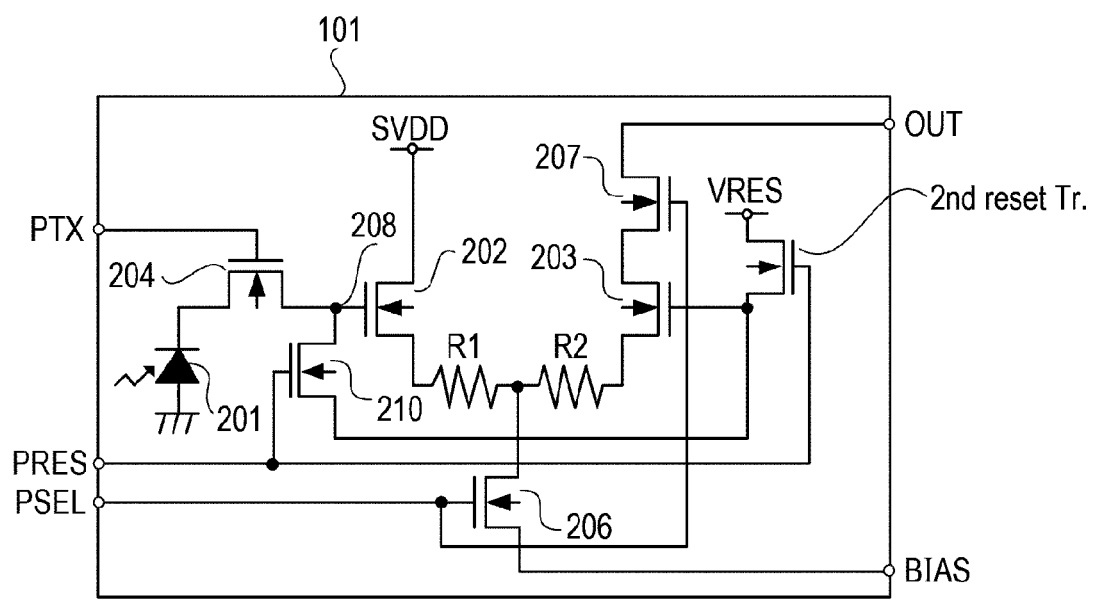
FIG. 4 illustrates an equivalent circuit of an exemplary pixel of an exemplary embodiment.

Other exemplary structure of the pixel 101 will be described in detail. FIG. 4 illustrates an equivalent circuit of the pixel 101 according to one or more embodiments. The reset transistor 209 in FIG. 3 is omitted in FIG. 4. Two transistors (the transfer transistor 204 and the connection transistor 210) are connected to the gate of the first input transistor 202. Two transistors (the second reset transistor and the connection transistor 210) are connected to the gate of the second input transistor 203. Accordingly, since the same number of the transistors is connected to each of the first and second input node of the differential amplifier, accuracy of the current signal may be improved.

In FIGS. 3 and 4, the first and second selection transistors 206, 207 are provided for selection of the pixel. Providing the first selection transistor 206 may reduce power consumption by cutting the current when the pixel is in a non-selective state. Providing the second selection transistor 207 may reduce the parasitic capacitance of the first output line 104.

One of the first and second selection transistors 206, 207 may be omitted. In case the second selection transistor 207 is omitted, accuracy of the current signal may be improved because the symmetrical characteristic of the two input nodes of the differential amplifier may be improved.

Further, a third selection transistor may be provided in an electrical path between the drain of the first input transistor 202 and the power source line. In case both of the second and third selection transistors are provided, accuracy of the current signal may be improved because the symmetrical characteristic of the differential amplifier may be improved.

In another case, both of the first and second selection transistors 206, 207 may be omitted. In this case, the pixel 101 may be set in non-selective state by providing the gate of the first and second input transistors 202, 203 with a voltage such that the both transistors 202, 203 are turned off. For example, such voltage may be provided from the reset voltage line. In case both of the first and second selection transistors 206, 207 are omitted, the fill factor of the pixel may be improved by reduction of the number of the pixel transistors.

Further, the pixel configuration in FIG. 3 may change such that a charge of the PD 201 may be transferred to the gate of the second input transistor 203. In other words, the transfer transistor may be provided not in an electrical path between the PD 201 and the gate of the first input transistor 202, but in an electrical path between the PD 201 and the gate of the second input transistor 203. In this case, since the same number of the transistors is connected to each of the first and second input node of the differential amplifier, accuracy of the current signal may be improved. Each gate of the first and second input transistors 202, 203 may be set in an electrically floating state after the reset voltage VRES is provided. Accordingly, the current signal corresponding to the difference of the voltages between the two input nodes may be output regardless of which one of the two input node the charge of the PD 201 is transferred to.

In FIGS. 3 and 4, provided is the connection transistor 210 which connected to the two input nodes of the differential amplifier. Accordingly, the reset noise, which is generated when the input nodes are reset, may be substantially equally divided into the two input nodes. Since the divided noises may cancel each other by the differential amplification, noises in the current signal may be reduced.

As shown in FIG. 1, the circuit for reading out the current signal corresponding to the amount of charges generated in the photoelectric conversion unit into the first output line 104, which is illustrated in each of FIGS. 2, 3 and 4, is repeatedly or periodically arranged. That is, the circuit illustrated in any one of FIGS. 2, 3 and 4 is provided for each of the plurality of the photoelectric conversion units.

In another case, the circuit illustrated in any one of FIGS. 2, 3 and 4 may be provided for every two or more of the plurality of the photoelectric conversion units. In detail, charges of two photoelectric conversion units may be transferred into the gate of the first input transistor 202, which is commonly provided for the two photoelectric conversion units. In this case, a plurality of the photoelectric conversion units may share the transistors other than the transfer transistor. Therefore the fill factor of the pixel may be improved by reduction of the number of the pixel transistors.

In the present embodiment, the transistors which are repeatedly provided so as to correspond to the plurality of the photoelectric conversion units may have the same conductivity type. Specifically, the first and second input transistors 202, 203, the transfer transistor 204, the reset transistor 205, the first and second selection transistors 206, 207, the reset transistor 209 and the connection transistor 210 are respectively N-type channel MOS transistors. In this case, since a single conductivity type of a well may be provided in the pixel 101, the fill factor of the pixel, which is a ratio of a region that the photoelectric conversion unit occupies to a region of a single pixel, may be improved. Therefore, sensitivity and/or a saturation amount of charges may be improved. However, a part of these transistors may have a different conductivity type from the others.

In the present embodiment, the electron may be used as the signal charge, and the N-type channel transistors may be provided. In this case, since the photoelectric conversion unit and the transistors may be provided in the same well, the fill factor of the pixel may be improved. Therefore, sensitivity and/or a saturation amount of charges may be improved. When a hole is used as the signal charge, P-type channel transistors may be used.

An element which is provided commonly for a plurality of the photoelectric conversion units, and is not repeatedly arranged may be included in the circuit for reading out the current signal corresponding to the amount of charges generated in the photoelectric conversion unit into the first output line 104. For example, the bias current source 102 in FIG. 1 may be included in the circuit for reading out because it may drive the differential amplifier by providing the bias current. In FIG. 1, the bias current source 102, however, is provided for each of the plurality of the pixel rows. Thus, the bias current source 102 is not an element which is repeatedly arranged so as to correspond to the plurality of the photoelectric conversion units.

Figure 8:
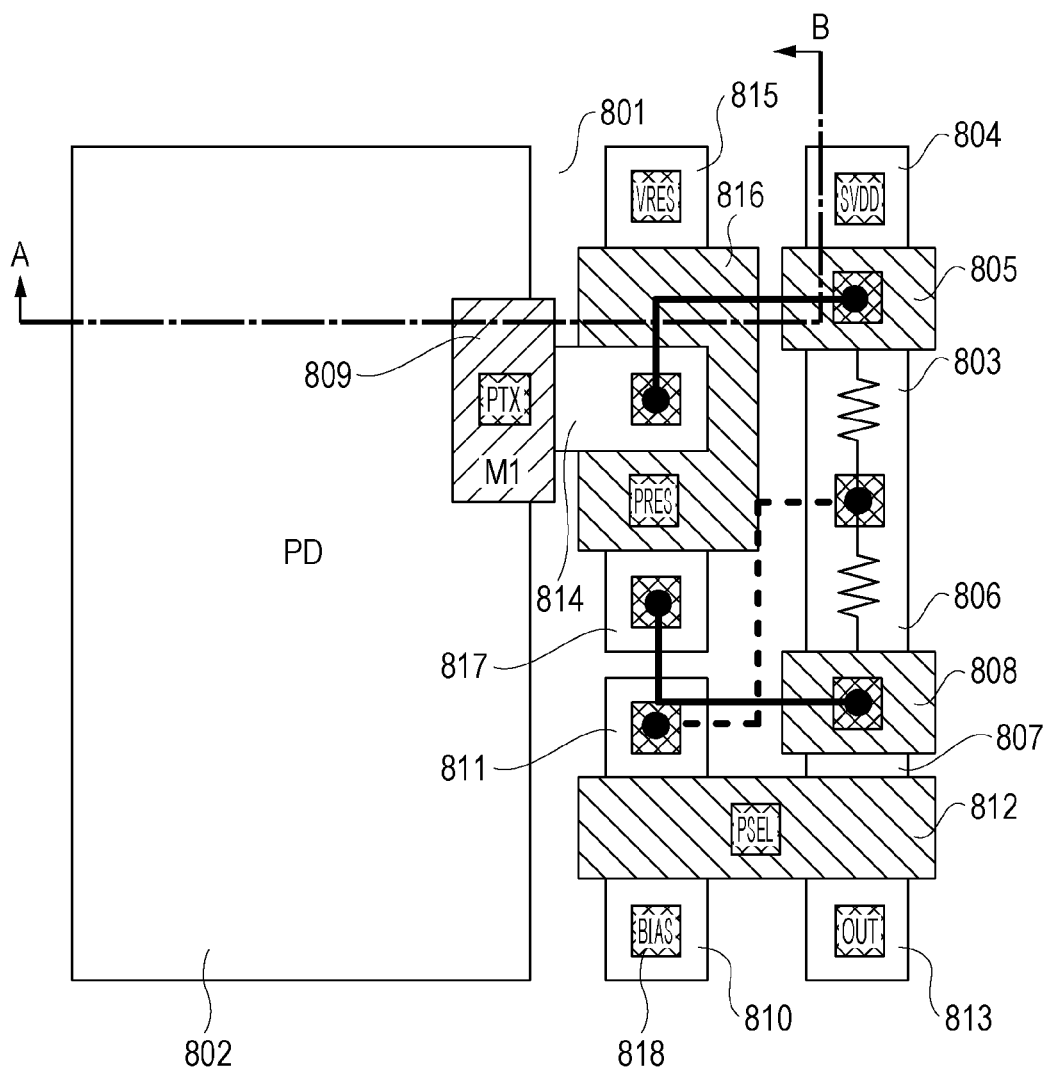
FIG. 8 is a schematic illustration of the planar structure of an exemplary pixel of an exemplary embodiment.

FIG. 8 is a schematic illustration of the planar structure of the pixel illustrated in FIG. 3. The pixel circuit may be provided in a semiconductor substrate, such as a silicon substrate or the like. The semiconductor substrate includes an active region, which is defined by an element isolation portion 801. Elements, such as photodiodes, transistors and resistors, may be provided in the active region.

The element isolation portion 801 may include an isolation structure such as LOCOS (Local Oxidation of Silicon) or STI (Shallow Trench Isolation). In another case, the element isolation portion 801 may include an isolation structure using a PN junction. The element isolation portion 801 may electrically isolate the PD and the transistors.

In the present embodiment, the MOS transistors are used in the pixel. Each transistor has a source region, a drain region, a gate electrode and a channel region. The source region, the drain region and the channel region are semiconductor regions provided in the semiconductor substrate. The gate electrode may be formed of a poly-silicon provided on the semiconductor substrate via an insulator film.

The PD 201 includes a semiconductor region 802. The first input transistor 202 may include semiconductor regions 803, 804 and a gate electrode 805 as the source, the drain and the gate. The second input transistor 203 may include semiconductor regions 806, 807 and a gate electrode 808 as the source, the drain and the gate. The semiconductor regions 803 and 806 may respectively form the resistors R1 and R2. The transfer transistor 204 may include a gate electrode 809 as the gate. The first selection transistor 206 may include semiconductor regions 810, 811 and a gate electrode 812 as the source, the drain and the gate. The second selection transistor 207 may include semiconductor regions 807, 813 and the gate electrode 812 as the source, the drain and the gate. The reset transistor 209 may include semiconductor regions 814, 815 and a gate electrode 816 as the source, the drain and the gate. The connection transistor 210 may include the semiconductor regions 814, 817 and the gate electrode 816 as the source, the drain and the gate.

Contact plugs 818 are provided for the gate electrode and the semiconductor regions each of which forms the source or the drain. The semiconductor regions and the gate electrode may be connected to conductive members included in interconnections via the contact plugs 818. For example, the semiconductor region 814 and the gate electrode 805 are connected to each other by the interconnection, and form the node 208 in FIG. 3.

As shown in FIG. 8, two nodes, which are supposed to be electrically connected to each other, may be formed of a common semiconductor region or a common gate electrode. For example, since the drain of the second input transistor 203 may be connected to the source of the second selection transistor 207, both nodes are formed of the semiconductor region 807. In another case, however, the two nodes may be formed of two separated semiconductor regions. The gate of the reset transistor 209 and the gate of the connection transistor 210 may be formed of two separated gate electrodes. Although, in FIG. 8, the resistors R1 and R2 are formed of the semiconductor regions 803 and 806, the resistors R1 and R2 may be thin film resistors formed of poly-silicon as the like.

As shown in FIG. 8, the structure from the gate electrode 805 to the gate electrode 808 may have symmetry with respect to a line. In this case, accuracy of the current signal may be improved because the symmetrical characteristic of the differential amplifier may be improved.

Figure 9:
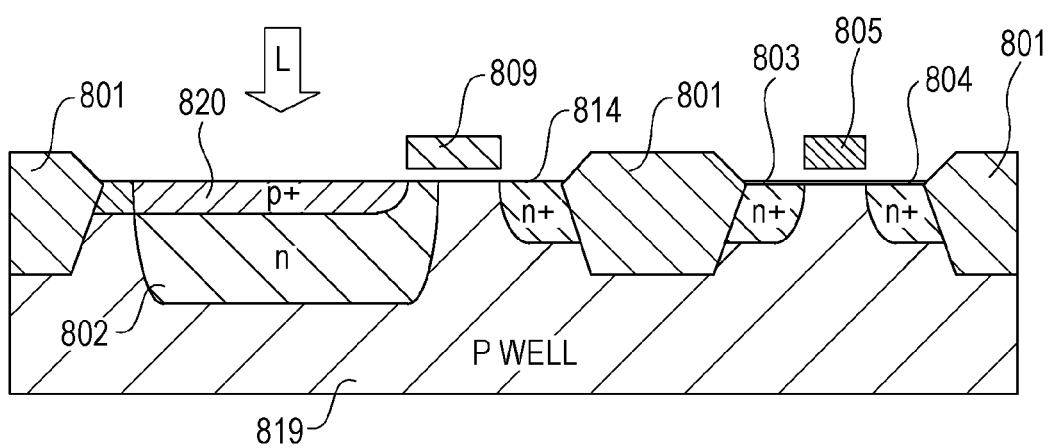
FIG. 9 is a schematic illustration of the cross-sectional structure of an exemplary pixel of an exemplary embodiment.

FIG. 9 is a schematic illustration of an exemplary cross-sectional structure taken along a line A-B in FIG. 8. The PD 201, the transfer transistor 204 and the first input transistor 202 are exemplarily illustrated in FIG. 9. The same reference symbol is used to indicate elements in FIG. 9 and FIG. 8 which perform the same or a similar function, and detailed descriptions of the elements are not repeated.

The PD 201 includes an N-type semiconductor region 802. The N-type semiconductor region 802 may accumulate generated charges therein. The first input transistor 202 may include N-type semiconductor regions 803 and 804 as the source and the drain. Accordingly, the first input transistor 202 may have an N-type channel. These N-type semiconductor regions may be provided in a P-type well 819. The P-type well 819 may be provided with the ground voltage GND.

The P-type well 819 may be a semiconductor region formed by diffusing or implanting impurities into the semiconductor substrate. In another case, the P-type well 819 may be formed by an epitaxial layer grown on the semiconductor substrate.

A P-type semiconductor region 820 is provided adjacent to the N-type semiconductor region 802 of the PD 201. The P-type semiconductor region 820 may be connected to the P-type well 819 and be provided with the ground voltage GND. The P-type semiconductor region 820 may reduce a noise caused by a dark current generated at the interface of the semiconductor substrate and an insulator.

In case the transistors which included in the pixel circuit have the same conductivity type, a single conductivity type of a well may be used in the pixel as shown in FIG. 9. Therefore, the fill factor of the pixel, which is a ratio of a region that the photoelectric conversion unit occupies to a region of a single pixel, may be improved.

In the present embodiment, the PD 201 which accumulates the electron may be formed by providing N-type semiconductor region 802 in the P-type well 819. In this case, since the photoelectric conversion unit and the transistors may be provided in the same well, the fill factor of the pixel may be improved. Therefore, sensitivity and/or a saturation amount of charges may be improved. When hole is used as the signal charge, P-type channel transistors may be used, and vice versa.

If two wells having different conductive type from each other are provided, a PN junction may be formed between the two wells. In this case, the elements are provided with a distance from the PN junction in order to avoid the influence the electrical field caused by the PN junction may impose on.

As shown in FIG. 9, light may enter the semiconductor substrate in a direction indicated by L. That is, the photoelectric conversion device illustrated in FIG. 9 is a front-side illuminated type.

Figure 10:
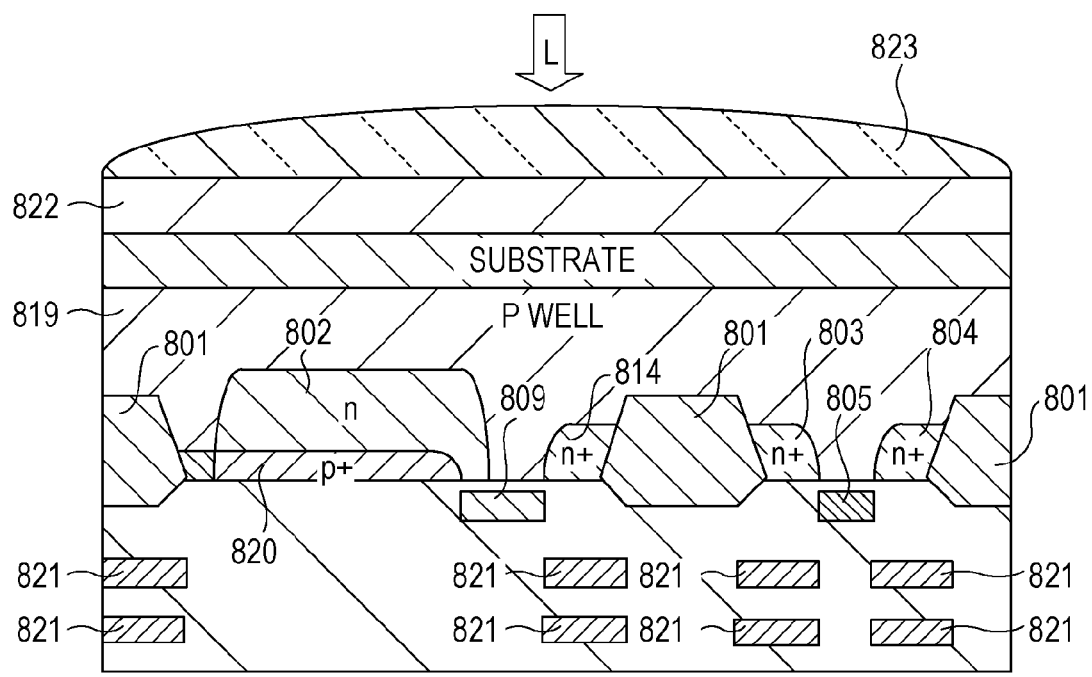
FIG. 10 is a schematic illustration of the cross-sectional structure of an exemplary pixel of an exemplary embodiment.

FIG. 10 is a schematic illustration of another exemplary cross-sectional structure taken along a line A-B in FIG. 8. The PD 201, the transfer transistor 204 and the first input transistor 202 are exemplarily illustrated in FIG. 10.

The photoelectric conversion device illustrated in FIG. 10 is a back-side illuminated type. In detail, light may enter the semiconductor substrate from a side (back side) opposite to a side (front side) on which the gate electrodes of the transistors are provided. L in FIG. 10 indicates a direction in which light may enter the semiconductor substrate.

The same reference symbol is used to indicate elements in FIG. 10 and FIG. 9 which perform the same or a similar function, and detailed descriptions of the elements are not repeated. A conductive member 821 included in an interconnection is shown in FIG. 10. Further, a color filter 822 and a lens 823 may be provided on the back side of the semiconductor substrate.

In the back-side illuminated type photoelectric conversion device, conductive members and gate electrodes, which may shield incident light, may be reduced on a side (back side) though which the incident light may enter the semiconductor substrate. Accordingly, sensitivity may be improved.

The photoelectric conversion device of the present embodiment may include a second semiconductor substrate. The second semiconductor substrate may include transistors in the circuit for reading out the current signal from the pixels or the signal processing circuit. The second semiconductor substrate may be provided on a first side of the conductive member 821, the first side being opposite to a second side of the conductive member 821 on which the PD 201 is provided. In another aspect of view, the (first) semiconductor substrate where the PD 201 is provided and the second semiconductor substrate where the transistors are provided may be arranged so as to face to each other with the conductive member included in the interconnection therebetween. In this case, the fill factor of the pixel may be improved by reduction of the number of the pixel transistors which are provided in the same semiconductor substrate as the PD 201.

Figure 5:
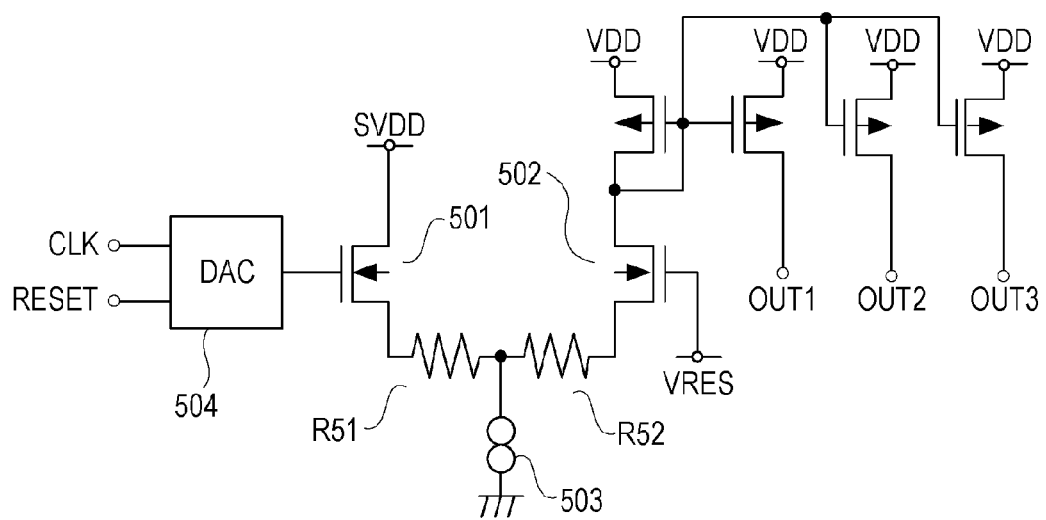
FIG. 5 illustrates an equivalent circuit of an exemplary ramp current signal source of an exemplary embodiment.

Hereinafter, an exemplary structure of the ramp current signal source 109 will be described in detail. FIG. 5 illustrates an equivalent circuit of the ramp current signal source 109 according to one or more embodiments. The ramp current signal source 109 may include a current output circuit and a current mirror circuit. The current output circuit may output a current corresponding to an input voltage. The current mirror may dispense the current from the current output circuit to a plurality of the comparators 108.

The current output circuit included in the ramp current signal source 109 of the present embodiment may be a differential amplifier. The differential amplifier of the ramp current signal source 109 may include a third input transistor 501 and a fourth input transistor 502. The third input transistor 501 and the fourth input transistor 502 may form a differential pair. The sources of the third and fourth input transistors 501 and 502 are electrically connected to a bias current source 503 respectively via resistors R51 and R52. The drain of the third input transistor 501 may be provided with the power source voltage SVDD. The drain of the fourth input transistor 502 is electrically connected to the current mirror circuit of the ramp current signal source 109.

The gate of the third input transistor 501 is electrically connected to a DAC (Digital to Analog Convertor) 504. The DAC 504 outputs a voltage signal, whose amplitude may vary step-by-step according to a clock signal CLK. According to the drive signal RESET provided for the DAC 504, the voltage signal is reset to an initial value. The gate of the second input transistor 502 is provided with the reset voltage VRES.

The drain current of the second input transistor 502 may vary on the basis of the voltage signal the DAC 504 outputs. The drain current of the second input transistor 502 may be the ramp current signal.

The current mirror circuit of the ramp current signal source 109 mirrors the drain current of the second input transistor 502 and input mirrored currents to the plurality of the comparators 108. An OUT1 node is electrically connected to the reference current input node 111 of the comparator 108 provided for the leftward column in FIG. 1. An OUT2 node is electrically connected to the reference current input node 111 of the comparator 108 provided for the middle column in FIG. 1. An OUT3 node is electrically connected to the reference current input node 111 of the comparator 108 provided for the rightward column in FIG. 1. The number of output-side transistors of the current mirror circuit of the ramp current signal source 109 may correspond to the number of the comparators 108. In another case, the ramp current signal source 109 may be provided for each of the plurality of the comparators 108. In this case, the current mirror circuit for dispensing the ramp current signals may be omitted.

The current output circuit included in the ramp current signal source 109 may have the same structure as, or a similar structure to the pixel amplification unit. In the present embodiment, the same differential amplifier is used for the ramp current signal source 109. Further, the ramp current signal source 109 may include a dummy transistor, which may correspond to the pixel transistor such as the reset transistor, the selection transistor or the connection transistor. In detail, the ramp current signal source 109 may be a circuit which substitutes the DAC 504 for the PD 201 of the circuit illustrated in any one of FIGS. 2, 3 and 4. In the case where the current output circuit included in the ramp current signal source 109 has the same structure as, or a similar structure to the pixel amplification unit, linearity in analog to digital conversion may be improved.

In another exemplary ramp current signal source 109, a voltage source including a constant current source and a capacitor may substitute for DAC 504. Since the constant current source is configured to charge the capacitor by a constant current, a voltage signal, whose amplitude may be continuously variable, may emerge at the capacitor. Accordingly, the ramp current signal source 109 outputs the ramp current signal, whose amplitude may be continuously variable.

The direction in which the ramp current signal varies, i.e. upward or downward, may be determined in accordance with the conductivity type of the signal charge and the conductivity type of the input transistors 202, 203. The amplitude of the ramp current signal may vary in a direction from amplitude of the current signal that the pixel 101 outputs in a dark situation to amplitude of the current signal that the pixel 101 outputs in a bright situation. The dark situation may include a situation where the voltage of the node 208 has been reset and charges are not transferred to the node 208.

In FIGS. 2, 3 and 4, the electron is used as the signal charge, and is transferred to the node 208, which is the gate of the first input transistor 202. The transfer of the electron may lower the voltage of the node 208. The more the charges are transferred, the lower the voltage of the node 208 may become. Since, in the bright situation, a large amount of charges may be transferred to the node 208, the voltage of the node 208 may be low. Since the input transistors 202, 203 have N-type channels, the amplitude of the current signal may be larger in the bright situation than in the dark situation. In this case, the ramp current signal whose amplitude varies from small to large (or upward) may be used.

In another case, the electron of the PD 201 may be transferred to the gate of the second input transistor 203. In this case, the more the charges are transferred, the smaller the amplitude of the current signal may become. Thus, the ramp current signal whose amplitude varies from large to small (or downward) may be used.

In the case where the hole is used as the signal charge, the above mentioned direction in which the amplitude of the ramp current signal varies may be inverted. Further, the case where the input transistors 202, 203 have P-type channels, the above mentioned direction in which the amplitude of the ramp current signal varies may be inverted.

Figure 6:
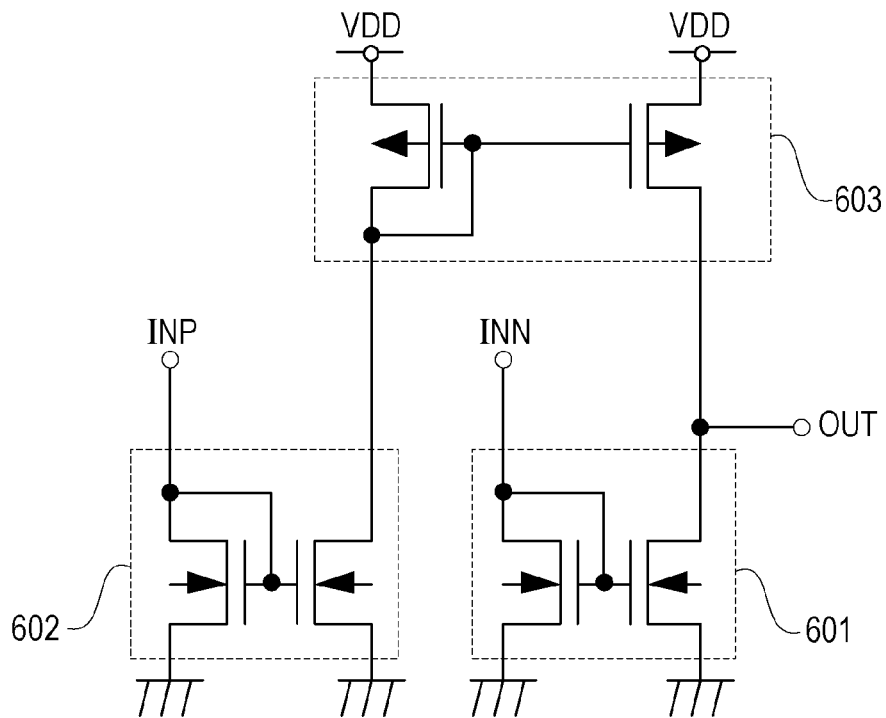
FIG. 6 illustrates an equivalent circuit of an exemplary comparator of an exemplary embodiment.

Hereinafter, an exemplary structure of the comparator 108 will be described in detail. FIG. 6 illustrates an equivalent circuit of the comparator 108 according to one or more embodiments. The comparator 108 may transmit the current signal input to the signal input node 110 and the reference current signal input to the reference current input node 111 to the output node 112. According to the amplitude relationship of the current signals, the comparator 108 may vary the voltage of the output node 112.

In FIG. 6, an INN node corresponds to the signal input node 110. An INP node corresponds to the reference current input node 111. An OUT node corresponds to the output node 112.

When a current is input to the INN node, the current may be transmitted to the OUT node via a first current mirror circuit 601. When a current is input to the INP node, the current may be transmitted to the OUT node via a second current mirror circuit 602 and a third current mirror circuit 603.

The OUT node is electrically connected to a ground voltage line via an output-side transistor of the first current mirror circuit 601. Further, the OUT node is electrically connected to a power source voltage line via an output-side transistor of the third current mirror circuit 603.

The current input via the INN node (the current signal from the pixel 101) may discharge the OUT node. On the other hand, the current input via the INP node (the ramp current signal) may charge up the OUT node.

When the current signal from the pixel 101 is larger than the ramp current signal, the voltage of the OUT node may be or get closer to the ground voltage GND (a first voltage). When the ramp current signal is larger than the current signal from the pixel 101, the voltage of the OUT node may be or get closer to the power source voltage VDD (a second voltage).

The current signals are transmitted to the OUT node via the current mirror circuits 601, 602 and 603. Since the OUT node has two transistors connected thereto, the capacitance of the OUT node may be reduced. Therefore, when the amplitude relationship of the current signal from the pixel 101 and the ramp current signal is inverted, the voltage of the output node (the OUT node) of the comparator 108 may quickly change. Thus, speed in analog to digital conversion may be improved.

In FIG. 6, each of the current input via the INN node and the current input via the INP node is transmitted to the OUT node via the current mirror circuit. In this case, the two transistors, which connected to the OUT node, may be arranged to be close to each other. Accordingly, a short wire may be used for the OUT node. Thus, the capacitance of the OUT node may be reduced.

Figure 7:
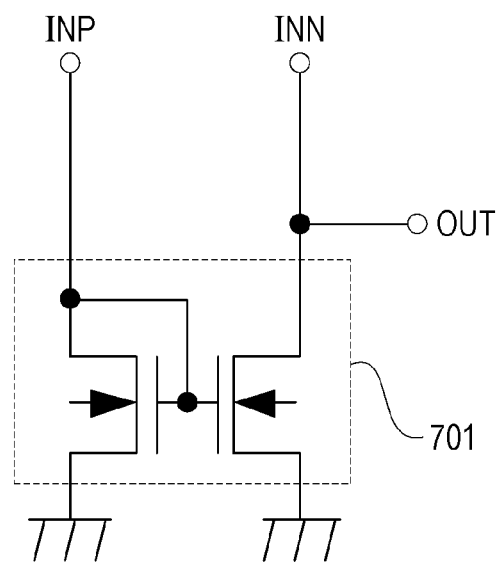
FIG. 7 illustrates an equivalent circuit of an exemplary comparator of an exemplary embodiment.

Hereinafter, another exemplary structure of the comparator 108 will be described in detail. FIG. 7 illustrates an equivalent circuit of the comparator 108 according to one or more embodiments. In FIG. 7, an INN node corresponds to the signal input node 110. An INP node corresponds to the reference current input node 111. An OUT node corresponds to the output node 112.

The INN node may be the OUT node. Thus, the voltage of the second output line 107 which is electrically connected to the INN node may vary according to the amplitude relationship of the current signals.

Although the first output line 104 is electrically connected to the plurality of the pixels 101, the second output line 107 is electrically connected to the first output line 104 via the current mirror circuit. Accordingly, only the output-side transistor 106 of the current mirror circuit may be connected to the second output line 107. Thus, even in the case where second output line 107 and the output node 112 are the same node, speed in analog to digital conversion may be improved.

The current input to the INP node may be transmitted to the OUT node via only the first current mirror circuit 701. Thus, the A-D convertor may be reduced in scale.

In the comparator 108 illustrated in FIG. 7, the current input via the INN node (the current signal from the pixel 101) may charge up the OUT node. On the other hand, the current input via the INP node (the ramp current signal) may discharge the OUT node.

When the current signal from the pixel 101 is larger than the ramp current signal, the voltage of the OUT node may be or get closer to power source voltage VDD (a first voltage). When the ramp current signal is larger than the current signal from the pixel 101, the voltage of the OUT node may be or get closer to the ground voltage GND (a second voltage).

Figure 11:
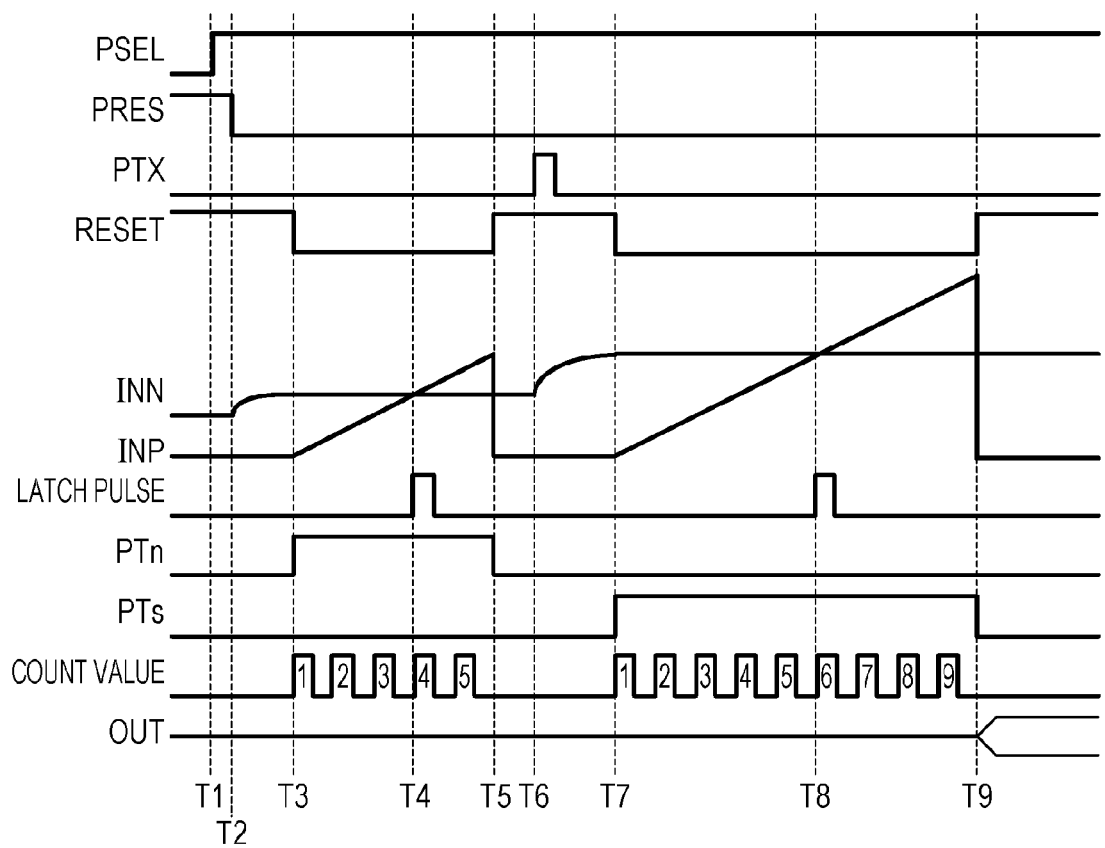
FIG. 11 is a timing chart of an exemplary operation for an exemplary embodiment.

Hereinafter, an exemplary operation for the photoelectric conversion device according to the present embodiment will be described. FIG. 11 is a timing chart of the drive signals. The drive signals PSEL, PRES, PTX, PTN and PTS, illustrated in FIG. 11, are respectively provided for the PSEL node, the PRES node, the PTX node, the PTN node and the PTS node, illustrated in FIG. 1.

The drive signal RESET represents the ramp reset signal, which is provided for the RESET node of the ramp current signal source 109, and the counter reset signal, which is provided for the RESET node of the counter 116. Since the ramp reset signal and the counter reset signal may synchronize with each other, the drive signal RESET in FIG. 11 represents both of the two signals. In another case, provided may be the ramp reset signal and the counter reset signal, which are not synchronized.

FIG. 11 illustrates the current signal INN, which is input to the signal input node 110 (INN node) of the comparator 108, and the ramp current signal INP, which is input to the reference current input node 111 (INP node) of the comparator 108. Further, FIG. 11 illustrates the latch pulse that the patch pulse generator 113 outputs and the count value that the counter 116 outputs.

Each of the drive signals may have at least two values which correspond to a high level and a low level. In analog circuits, the high level of the drive signal may turn on the corresponding transistor. The low level of the drive signal may turn off the corresponding transistor.

Before T1, the PRES and RESET are of high levels. The other drive signals are of low levels. At this time, the reset voltage VRES is provided for the node 208 and the gate of the second input transistor 203. Since the drive signal RESET is a high level, each of the ramp current signal source 109 and the counter 116 is in a state of being reset, or of outputting the initial value.

At T1, the PSEL turns into a high level, whereby the pixel may be selected. Thus, the current signal according to the voltage of the input node of the pixel amplification unit may be output via the OUT node.

At T2, the PRES turns into a low level, whereby the node 208 may become electrically floating. In the pixel illustrated in FIG. 3, the node 208 and the gate of the second input transistor 203 may become electrically floating.

At T3, the RESET turns into a low level, and the PTN turns into a high level. With the RESET's turning into the low level, the amplitude of the ramp current signal may start to change from the initial value. In the present embodiment, the amplitude of the ramp current signal may change upward. Further, the counter 116 may start to count at this time.

At T3, the voltage of the input node (node 208) of the pixel amplification unit is the reset voltage VRES. Accordingly, a current signal that the pixel outputs when in a state of being reset is compared with the ramp current signal. The current signal that the pixel outputs when in a state of being reset may contain a reset nose, which is generated when the reset transistor turns off.

At the inversion of the amplitude relationship between the ramp current signal and the current signal from the pixel (at T4), the latch pulse is input to the N latch circuit 114, whereby the N latch circuit 114 may store the count value at T4.

At T5, the RESET turns into a high level, whereby the ramp current signal source 109 and the counter 116 are reset. Then, the PTN turns into a low level.

At T6, the PTX turns into a high level, whereby the charge generated at PD 201 may be transferred to the node 208. At this time, the whole charges of the PD 201 may be transferred to the node 208. After a period passes since T6, the PTX turns into a low level.

By the transfer of the charges to the node 208, the voltage of the node 208 may change from the reset voltage VRES. The amount of the voltage change may be defined by the amount of the charges transferred. On the other hand, the voltage of the gate of the second input transistor 203 may be kept at the reset voltage VRES. Thus, the voltage difference according to the amount of the charges may emerge between the two input nodes of the differential amplifier, and the differential amplifier may output the current signal according to the voltage difference.

At T7, the RESET turns into a low level, and the PTN turns into a high level. With the RESET's turning into the low level, the amplitude of the ramp current signal may start to change from the initial value. Further, the counter 116 may start to count at this time. Since the PTN is the high level, the count value from the counter 116 is input to the S latch circuit 115.

At T7, the voltage of the input node (node 208) of the pixel amplification unit is a voltage corresponding to the amount of the charges generated by the incident light. Accordingly, a current signal corresponding to the amount of the incident light is compared with the ramp current signal. The current signal corresponding to the amount of the incident light may contain a reset noise, which is generated when the reset transistor turns off.

At the inversion of the amplitude relationship between the ramp current signal and the current signal from the pixel (at T8), the latch pulse is input to the S latch circuit 115, whereby the S latch circuit 115 may store the count value at T8.

At T9, the RESET turns into a high level, and then the analog to digital conversion may be accomplished. From T9, the output portion may start to output the digital signals.

In the pixel corresponding to FIG. 3, a timing of turning off the reset transistor 209 and a timing of turning off the connection transistor 210 may be offset. In detail, the reset transistor 209 turns off before the connection transistor 210 turns off. By this order of the operation, the reset noises, which is generated when the reset transistor 209 turns off, may be substantially equally divided into the two input nodes. As the result, since the divided noises may cancel each other by the differential amplification, noises in the current signal may be reduced.

The read out of the current signal that the pixel outputs when in a state of being reset may be omitted. Even though the read out of the current signal that the pixel outputs when in a state of being reset is omitted, an offset noise of the pixel and the reset noise may be reduced because the pixel amplification unit is the differential amplifier. However, with the read out of the current signal that the pixel outputs when in a state of being reset, offset noises generated in the subsequent states of the pixel may be reduced.

Hereinafter, another exemplary operation for the photoelectric conversion device according to the present embodiment will be described. In this operation, the drive signal PSEL may be provided parallel for the pixels in a plurality of the pixel rows. Thus, the pixels in the plurality of the pixel rows may simultaneously output the current signals to the same first output line 104. According to this way of operation, the current signals may be summed up or averaged at the first output line 104. In this case, each of the drive signals PSEL, PRES, PTX may be provided for the pixels in the plurality of the pixel rows simultaneously.

For addition of two current signals from two pixels, the bias current source 102 may output the bias current which has the amplitude twice as large as that of the bias current the bias current source 102 may output when the current signal from a single pixel is individually output. Then each of the differential amplifiers of the two pixels may be provided with the bias current as large as that provided when the current signal from a single pixel is individually output. Accordingly, the current signals to be added to each other, or summed up, may have respectively the same amplitude as output individually. In the case where the current signals from more than two pixels are summed up, the bias current may be turned up in accordance with the number of the signals to be summed up. For the average of the current signals, the bias current may be set in the same amplitude when the current signal from a single pixel is being output.

The current signal from the pixel may be amplified or attenuated in the analog to digital conversion by controlling the amplification factor of the current mirror circuit of the ramp current signal source 109. In the case where two current signals are added, for example, the amplification factor may be set to two.

As described above, in the present embodiment, the current signal from the pixel is mirrored by the current mirror circuit, and the mirrored signal is compared with the ramp current signal. According to the embodiment, it may be possible to compare the current signal from each of the signal sources with the reference current signal even though those signal sources are not connected to the comparator, especially the output node of the comparator. It may be possible to reduce the parasitic capacitance of the output node, where a voltage signal representing a result of the comparison may be output. Hence, the comparison of the current signals may be conducted in a short time.

In the present embodiment, the A-D convertor is provided for each pixel column. In the A-D convertor, the voltage of the output node may change from the first voltage to the second voltage (or otherwise) when the amplitude relationship of the current signal from the pixel and the ramp current signal is inverted. In other words, the voltage of the output node may be inverted. If it takes long to invert the voltage of the output node since the inversion of the amplitude relationship, the generation of the latch pulse may be delayed. Since the counter may continue to count up because of the delay of the latch pulse, the latch circuit may store a wrong count value. For prevention the above mentioned error, a clock signal of a low frequency may be used, which results in a deterioration in the speed of the analog to digital conversion.

On the contrary, in the present embodiment, since the parasitic capacitance of the output node may be reduced, the voltage of the output node may be quickly inverted. As a result, the above mentioned error may be reduced when a clock signal of a high frequency is used. Hence, speed of the analog to digital conversion may be improved.

Second Exemplary Embodiment

Figure 12:
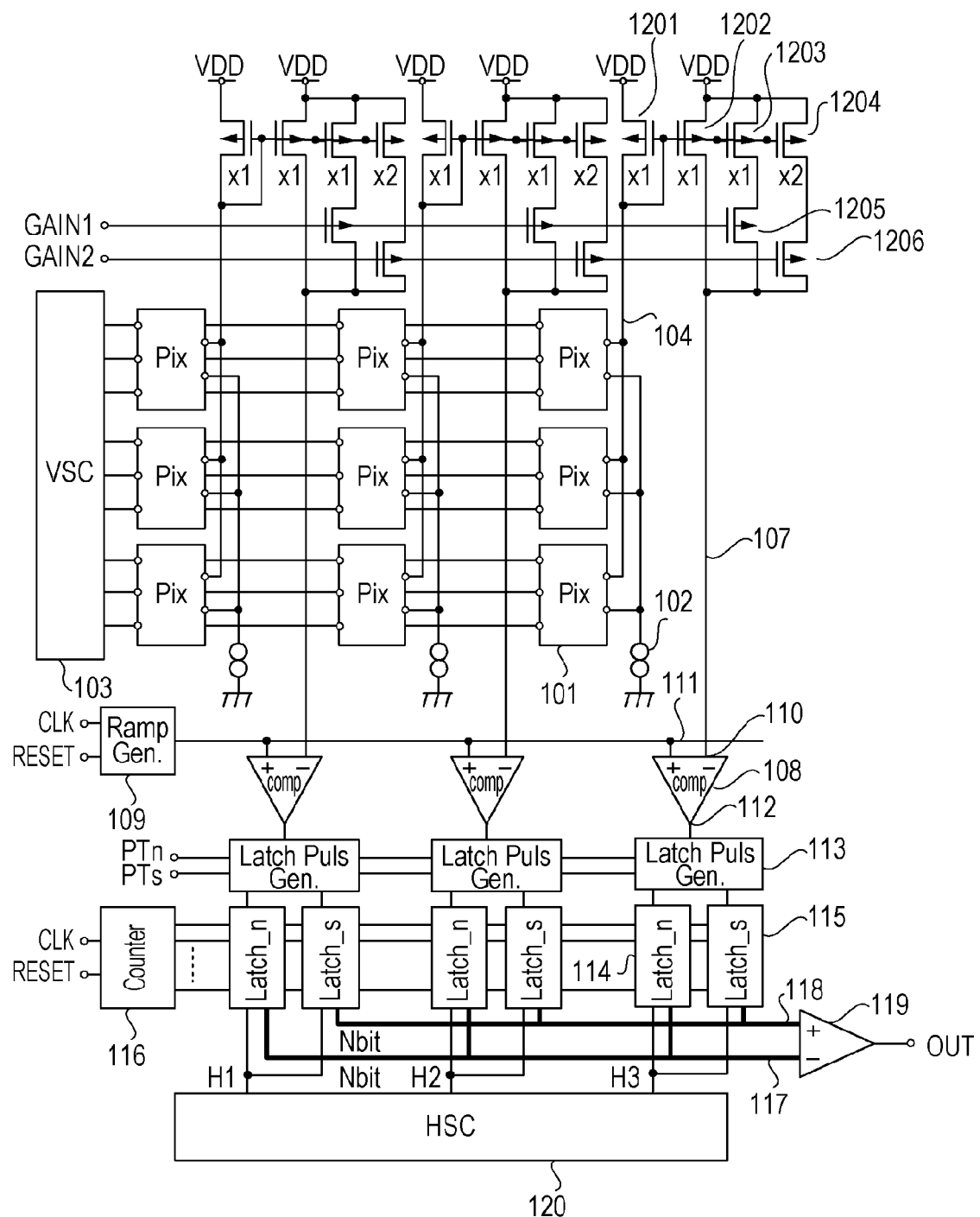
FIG. 12 illustrates an equivalent circuit of a second exemplary embodiment.

FIG. 12 illustrates an equivalent circuit of a photoelectric conversion device according to one or more embodiments. The same reference symbol is used to indicate elements in FIG. 12 and FIG. 1 which perform the same or a similar function, and detailed descriptions of the elements are not repeated.

The photoelectric conversion device of the present embodiment includes a plurality of pixels, a current mirror circuit, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which output from the pixel as an analog signal, into a digital signal. According to drive signals the horizontal scanning circuit provides, the digital signal is read out to the output portion. The output portion outputs the digital signal to the outside of the device.

In the present embodiment, the amplification factor, or the gain, of the current mirror circuit is controllable. The other features may be the same as the above described embodiment. The detailed explanation of the same features as the above described embodiment is not repeated.

The current mirror circuit includes an input-side transistor 1201 and three output-side transistors 1202, 1203 and 1204. The input and output-side transistors 1201, 1202, 1203, 1204 are P-type channel MOS transistors.

The gate and the drain of the input-side transistor 1201 are shorted. The source of the input-side transistor 1201 is electrically connected to a power source line. The power source line may provide the source of the input-side transistor 1201 with a power source voltage VDD. The first output line 104 is electrically connected to the drain of the input-side transistor 1201 and the gate which is shorted to the drain of the input-side transistor 1201.

The output-side transistors 1202, 1203 and 1204 are arranged in parallel. In detail, the sources of the output-side transistors 1202, 1203 and 1204 are respectively connected to the power source line. The power source line may provide the sources of the output-side transistors 1202, 1203 and 1204 with the power source voltage VDD. The gates of the output-side transistors 1202, 1203 and 1204 are respectively connected to the gate of the input-side transistor 1201. The drains of the output-side transistors 1202, 1203 and 1204 are respectively connected to the second output line 107.

The input-side transistor 1201 and the first and second output-side transistors have the substantially same channel widths. The third output-side transistor 1204 has twice as wide a channel width as the input-side transistor 1201. The input and output-side transistors 1201, 1202, 1203 and 1204 have the substantially same channel length.

A first gain control switch 1205 is arranged in an electrical path between the drain of the second output-side transistor 1203 and the second output line 107. The first gain control switch 1205 is a P-type channel MOS transistor. A drive signal GAIN1 may control the first gain control switch 1205 to be turned on or off.

A second gain control switch 1206 is arranged in an electrical path between the drain of the third output-side transistor 1204 and the second output line 107. The second gain control switch 1206 is a P-type channel MOS transistor. A drive signal GAIN2 may control the second gain control switch 1206 to be turned on or off.

The first and second gain control switches 1205 and 1206 may control the amplification factor of the current mirror circuit. The first and second gain control switches 1205 and 1206 may be included in an amplification factor control portion. By the two gain control switches 1205 and 1206, four of gains are to be set.

When both of the first and second gain control switches 1205 and 1206 are turned off, the second and third output-side transistors 1203 and 1204 are disconnected from the second output line 107. Accordingly, only the first output-side transistor 1202 of the three may be connected to the second output line 107. In this case, the mirrored current signal may be output at the amplification factor of about 1.

When the first gain control switch 1205 is turned on and the second gain control switch 1206 is turned off, the third output-side transistors 1204 is disconnected from the second output line 107. Accordingly, the first and second output-side transistors 1202 and 1203 of the three may be connected to the second output line 107. A virtual output-side transistor has twice as wide a channel width as the input-side transistor 1201 may be considered. In this case, the mirrored current signal may be output at the amplification factor of about 2.

When the first gain control switch 1205 is turned off and the second gain control switch 1206 is turned on, the second output-side transistors 1203 is disconnected from the second output line 107. Accordingly, the first and third output-side transistors 1202 and 1204 of the three may be connected to the second output line 107. A virtual output-side transistor has three times as wide a channel width as the input-side transistor 1201 may be considered. In this case, the mirrored current signal may be output at the amplification factor of about 3.

When both of the first and second gain control switches 1205 and 1206 are turned on, all of the three output-side transistors 1202, 1203 and 1204 may be connected to the second output line 107. A virtual output-side transistor has four times as wide a channel width as the input-side transistor 1201 may be considered. In this case, the mirrored current signal may be output at the amplification factor of about 4.

As mentioned above, the amplification factor of the current mirror circuit is controllable.

In FIG. 12, three output-side transistors are arranged. However, the number of the output-side transistors is not limited to three. According to the size of each of the transistors, the amplification factor may be determined.

In the case where the current signals from the pixels are individually output, the amplification factor may be changed.

For example, the amplification factor may be controlled to be large when the current signal from the pixel has a small amplitude, while being small when the current signal from the pixel has a large amplitude.

The amplification factor may be changed between the case where the current signal from a single pixel is output and the case where the current signals from a plurality of the pixels are simultaneously output. For adding or averaging the current signals, a small amplification factor may be used. The small amplification factor may result in a large dynamic range at the subsequent stages.

An exemplary structure of the pixel may be the same as the above described embodiment. The equivalent circuit of the pixel is illustrated in FIG. 2, 3 or 4. The exemplary planar and cross-sectional structures of the pixel is illustrated in FIGS. 8, 9 and 10.

An exemplary operation for the photoelectric conversion device according to the present embodiment may be the same as the above described embodiment. The photoelectric conversion device may be operated according to the drive signals illustrated in FIG. 11.

In the present embodiment, since the amplification factor of the current mirror circuit is controllable, a wide dynamic range and a high signal-to-noise ratio (SN ratio) may be obtained. For capturing a dark object, improvement in SN ratio may be obtained because of a high gain of the current mirror circuit. For capturing a bright object, which is less effected by noises, improvement in dynamic range may be obtained because of a low gain of the current mirror circuit.

Third Exemplary Embodiment

Figure 13:
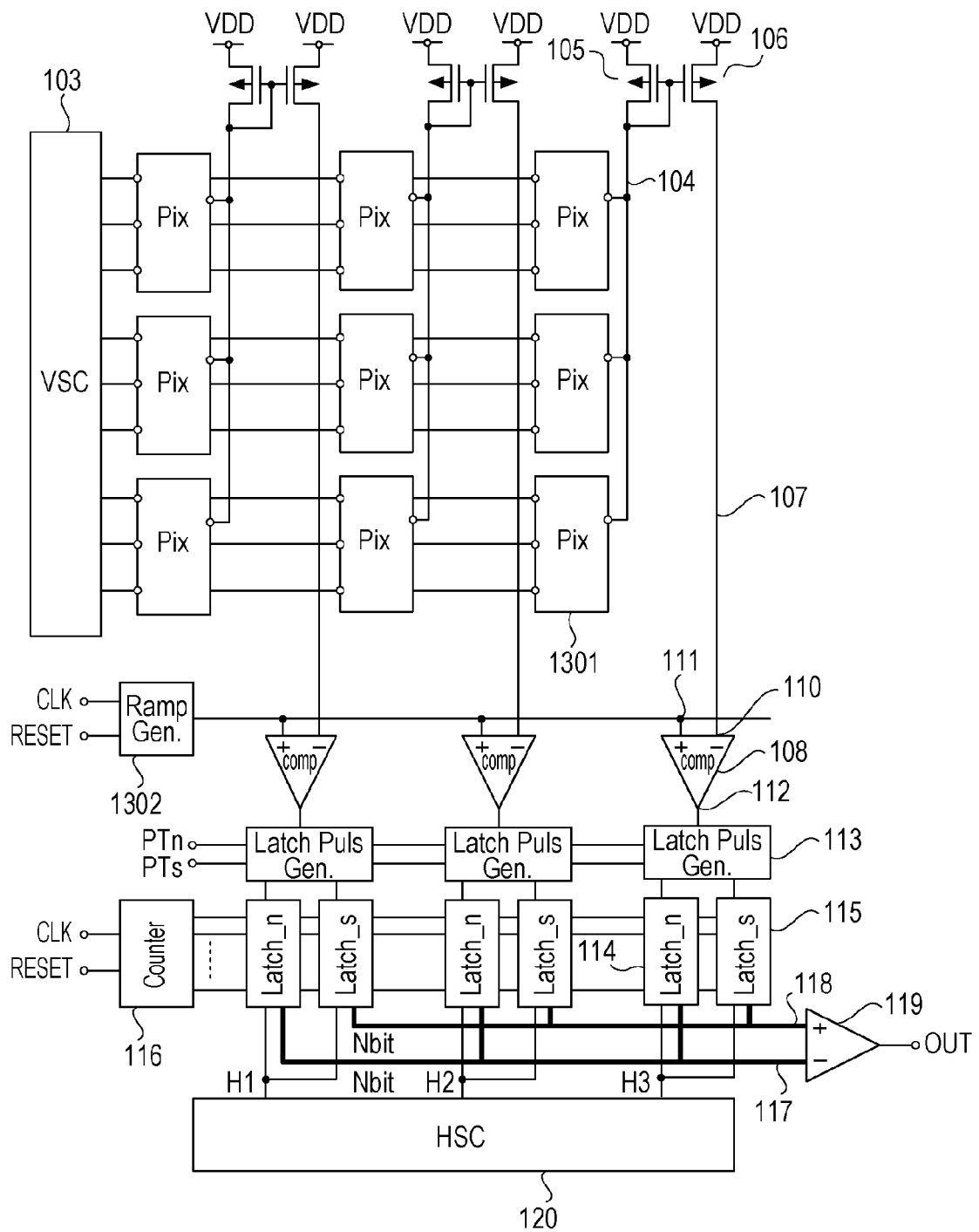
FIG. 13 illustrates an equivalent circuit of a third exemplary embodiment.

FIG. 13 illustrates an equivalent circuit of a photoelectric conversion device according to one or more embodiments. The same reference symbol is used to indicate elements in FIG. 13 and either one of FIG. 1 or 12 which perform the same or a similar function, and detailed descriptions of the elements are not repeated.

The photoelectric conversion device of the present embodiment includes a plurality of pixels, a current mirror circuit, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which output from the pixel as an analog signal, into a digital signal. According to drive signals the horizontal scanning circuit provides, the digital signal is read out to the output portion. The output portion outputs the digital signal to the outside of the device.

In the present embodiment, a structure of the pixel is different from those of the above described embodiments. Further, a structure of the ramp current signal source may be different from those of the above described embodiments. The other features may be the same as the above described embodiments. The detailed explanation of the same features as the above described embodiments is not repeated.

The pixel 1301 includes OUT node, via which the current signal from the pixel 1301 is output. The pixel 1301 may further includes a plurality of nodes (PTX node, PRES node and PSEL node), via which drive signals are provided. The pixel 1301 does not include a BIAS node. Therefore, a bias current source 102 which is provided for each of the pixel columns is omitted. The other nodes have the same configuration as the above described embodiments.

The pixel 1301 includes at least the photoelectric conversion unit and the pixel amplification unit. Incident light may be converted into a charge by the photoelectric conversion unit. The pixel amplification unit may output a current signal corresponding to the amount of charges generated by the photoelectric conversion unit.

Figure 14:
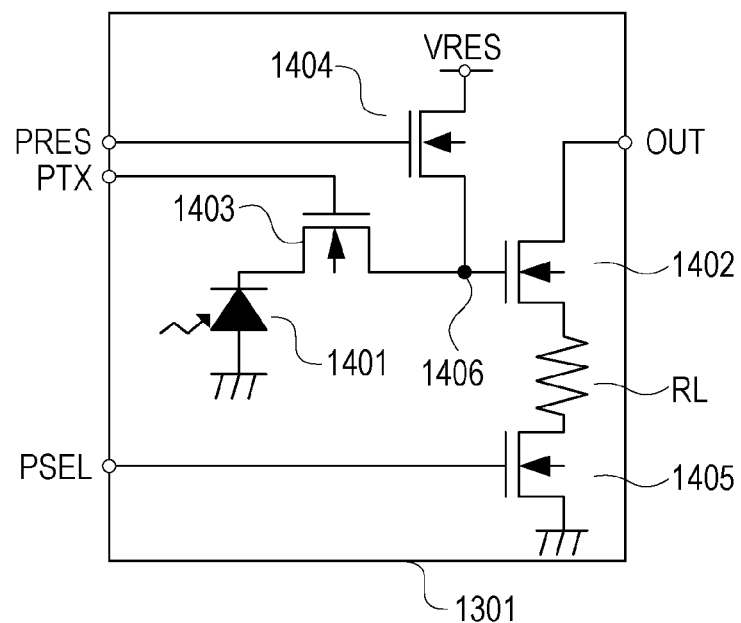
FIG. 14 illustrates an equivalent circuit of an exemplary pixel of an exemplary embodiment.

FIG. 14 illustrates an equivalent circuit of the pixel 101 according to one or more embodiments. The photoelectric conversion unit may be, for example, a photodiode (below, PD) 1401. The pixel amplification unit may be, for example, a common source amplifier. The common source amplifier includes an amplification transistor 1402 and a load resistor RL. The pixel 1301 may include a transfer transistor 1403, a reset transistor 1404, a selection transistor 1405.

The anode of the PD 1401 is provided with a ground voltage GND. The cathode of the PD 1401 is electrically connected to a node 1406 via the transfer transistor 1403. The transfer transistor 1403 transfers the charges generated at the PD 1401 to the node 1406.

The gate of the amplification transistor 1402 is electrically connected to the node 1406. The gate of the amplification transistor 1402 is an input node of the common source amplifier. The voltage at the gate of the amplification transistor 1402 may be a voltage corresponding to the amount of charges which are transferred to the node 1406. In another aspect, the transferred charges are converted into a voltage signal at the node 1406. The drain of the amplification transistor 1402 is electrically connected to the OUT node. The source of the first input transistor 1402 is electrically connected to the drain of the selection transistor 1405 via the load resistor RL.

The node 1406 is electrically connected to the reset voltage line via the reset transistor 1404. When the reset transistor 1404 is turned on, the node 1406 is provided with the reset voltage VRES. In other words, the reset transistor 1404 may reset the voltage of the first input node of the common source amplifier.

The drain of the selection transistor 1405 is electrically connected to the load resistor RL. The source of the selection transistor 1405 may be provided with the ground voltage GND.

The gate of the transfer transistor 1403 is electrically connected to the PTX node. The gate of the reset transistor 1404 is electrically connected to the PRES node. The gate of the selection transistor 1405 is electrically connected to the PSEL node. The vertical scanning circuit 103 provides each gate of the transistors with a drive signal for controlling each of the transistors to be turned on or off.

The current signal corresponding to the amount of charges which are transferred to the input node of the common source amplifier may be output via the OUT node into the first output line 104. The selection transistor 1405 may select a pixel 1301 which outputs the current signal, out of the plurality of the pixels 1301. In detail, when the selection transistor 1405 is turned on, the common source amplifier may output the current signal via the OUT node.

The load resistor RL may include a MOS transistor with a diode-type connection, where the gate and the drain are shorted. In the case where the MOS transistor with a diode-type connection is used, the fill factor of the pixel may be improved by reduction of the size of the element. Therefore, sensitivity and/or a saturation amount of charges may be improved.

Figure 15:
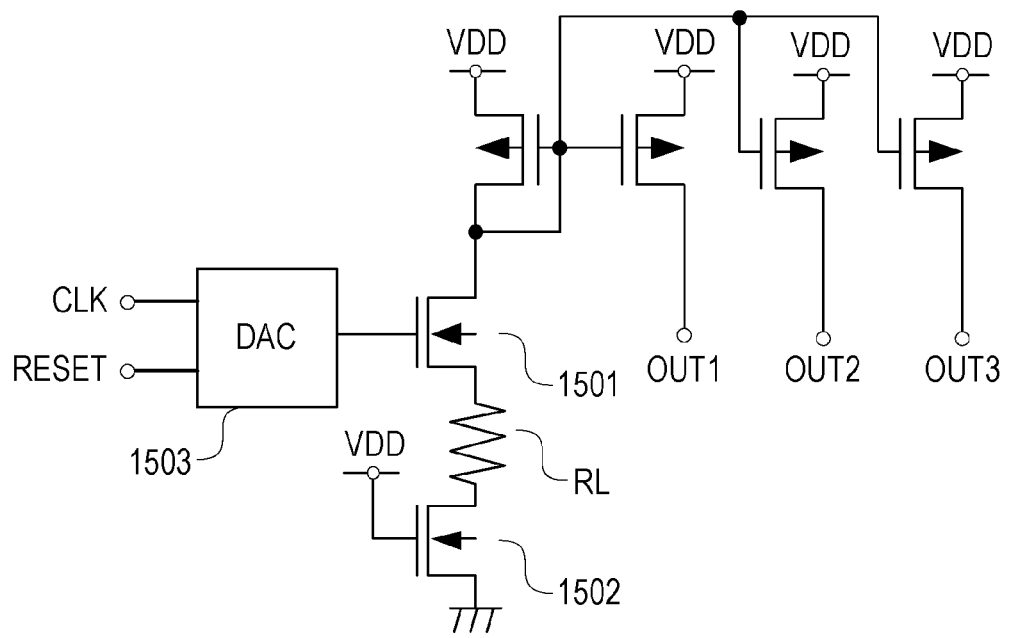
FIG. 15 illustrates an equivalent circuit of an exemplary ramp current signal source of an exemplary embodiment.

Hereinafter, an exemplary structure of the ramp current signal source 1302 will be described in detail. FIG. 15 illustrates an equivalent circuit of the ramp current signal source 1302 of the present embodiment. The ramp current signal source 1302 may include a current output circuit and a current mirror circuit. The current output circuit may output a current corresponding to an input voltage. The current mirror circuit may dispense the current from the current output circuit to a plurality of the comparators 108.

The current output circuit included in the ramp current signal source 1302 of the present embodiment may be a common source amplifier. The common source amplifier of the ramp current signal source 1302 may include an amplification transistor 1501 and a load resistor RL. The source of the amplification transistor 1501 is electrically connected to the load resistor RL. The drain of the amplification transistor 1501 is electrically connected to the current mirror circuit.

The load resistor RL is electrically connected to a drain of a load transistor 1502. The source of the load transistor 1502 is electrically connected to the ground voltage line. The gate of the load transistor 1502 may be provided with the power source voltage VDD. The load transistor 1502 may correspond to the selection transistor 1405 of the pixel 1301. The load transistor 1502 may be arranged such that the pixel and the ramp current signal source 1302 may have the same or similar structures.

The gate of the amplification transistor 1501 is electrically connected to a DAC (Digital to Analog Convertor) 1503. The function of the DAC 1503 may be the same as the DAC 504 in the above described embodiments. The detailed description of the DAC 1503 is not repeated.

The drain current of the amplification transistor 1501 may vary on the basis of the voltage signal the DAC 1503 outputs. The drain current of the amplification transistor 1501 may be the ramp current signal.

The current mirror circuit of the ramp current signal source 1302 mirrors the drain current of the amplification transistor 1501 and input mirrored currents to the plurality of the comparators 108. An OUT1 node is electrically connected to the reference current input node 111 of the comparator 108 provided for the leftward column in FIG. 13. An OUT2 node is electrically connected to the reference current input node 111 of the comparator 108 provided for the middle column in FIG. 13. An OUT3 node is electrically connected to the reference current input node 111 of the comparator 108 provided for the rightward column in FIG. 13. The number of output-side transistors of the current mirror circuit of the ramp current signal source 1302 may correspond to the number of the comparators 108. In another case, the ramp current signal source 1302 may be provided for each of the plurality of the comparators 108. In this case, the current mirror circuit for dispensing the ramp current signals may be omitted.

The current output circuit included in the ramp current signal source 1302 may have the same structure as, or a similar structure to the pixel amplification unit. In the present embodiment, the same common source amplifier is used for the ramp current signal source 1302. Further, the ramp current signal source 1302 may include a dummy transistor, which may correspond to the pixel transistor such as the reset transistor or the transfer transistor. In detail, the ramp current signal source 1302 may be a circuit which substitutes the DAC 1503 for the PD 1401 of the circuit illustrated in FIG. 14. In the case where the current output circuit included in the ramp current signal source 1302 has the same structure as, or a similar structure to the pixel amplification unit, linearity in analog to digital conversion may be improved.

In other cases, the ramp current signal source 1302 may be replaced by the ramp current signal source 109, or vice versa.

Figure 16:
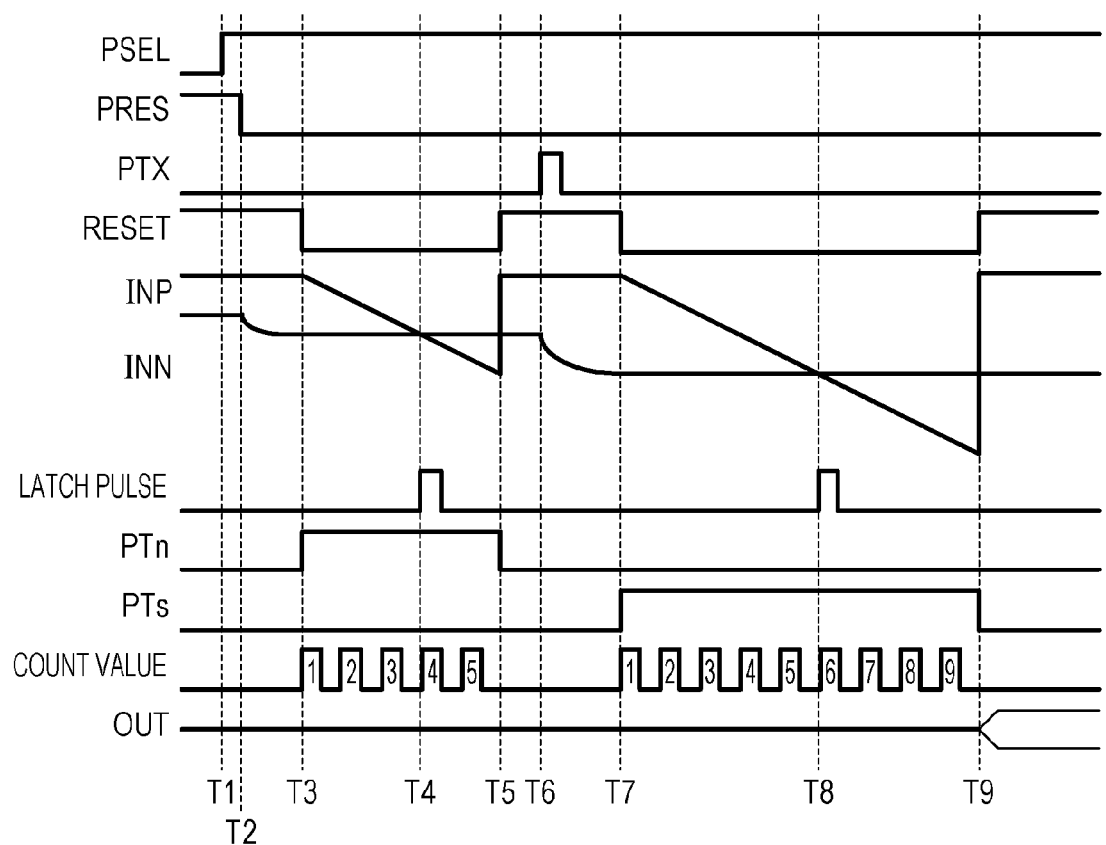
FIG. 16 is a timing chart of an exemplary operation for an exemplary embodiment.

An exemplary operation for the photoelectric conversion device according to the present embodiment may be the same as the above described embodiments. The photoelectric conversion device may be operated according to the drive signals illustrated in FIG. 16. In FIG. 16, the direction in which the ramp current signal may change is inverted from that in FIG. 11.

The direction in which the ramp current signal varies, i.e. upward or downward, may be determined in accordance with the conductivity type of the signal charge and the conductivity type of the amplification transistor 1402. The amplitude of the ramp current signal may vary in a direction from amplitude of the current signal that the pixel 1301 outputs in a dark situation to amplitude of the current signal that the pixel 1301 outputs in a bright situation. The dark situation may include a situation where the voltage of the node 1406 has been reset and charges are not transferred to the node 1406.

In FIG. 14, the electron is used as the signal charge, and is transferred to the node 1406, which is the gate of the amplification transistor 1402. The transfer of the electron may lower the voltage of the node 1406. The more the charges are transferred, the lower the voltage of the node 1406 may become. Since, in the bright situation, a large amount of charges may be transferred to the node 1406, the voltage of the node 1406 may be low. Since the amplification transistors 1402 has an N-type channel, the amplitude of the current signal may be smaller in the bright situation than in the dark situation. In this case, the ramp current signal whose amplitude varies from large to small (or downward) may be used.

In the case where the hole is used as the signal charge, the above mentioned direction in which the amplitude of the ramp current signal varies may be inverted. Further, the case where the amplification transistors 1402 has a P-type channel, the above mentioned direction in which the amplitude of the ramp current signal varies may be inverted.

In the present embodiment, the pixel includes the common source amplifier. The common source amplifier may include a smaller number of elements than a differential amplifier. Hence, the fill factor of the pixel may be improved by reduction of the number of the pixel transistors. Therefore, sensitivity and/or a saturation amount of charges may be improved.

Fourth Exemplary Embodiment

Figure 17:
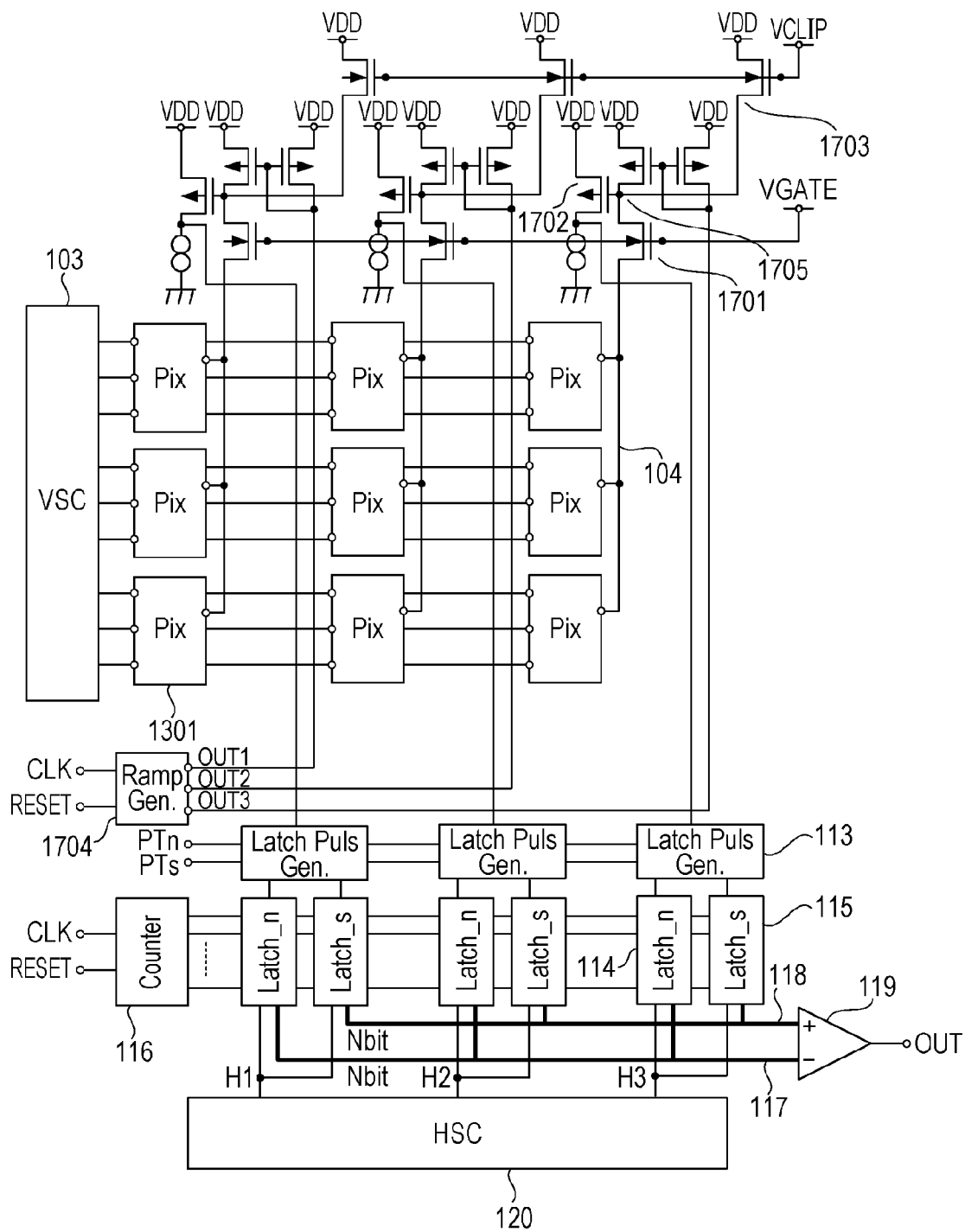
FIG. 17 illustrates an equivalent circuit of a fourth exemplary embodiment.

FIG. 17 illustrates an equivalent circuit of a photoelectric conversion device according to one or more embodiments. The same reference symbol is used to indicate elements in FIG. 17 and one of FIG. 1, 12 or 13 which perform the same or a similar function, and detailed descriptions of the elements are not repeated.

In the present embodiment, the current signal from the pixel is input to the comparator via an impedance conversion portion, and then compared with the ramp current signal. While, in the above described embodiments, the impedance conversion portion may be the current mirror circuit, in the present embodiment, the impedance conversion portion is a common gate amplifier.

The photoelectric conversion device of the present embodiment includes a plurality of pixels, a common gate amplifier, an analog to digital convertor (A-D convertor), an output portion, a vertical scanning circuit and a horizontal scanning circuit. In each of the pixels, incident light may be converted into a charge. The vertical scanning circuit provides the pixels with drive signals. In accordance with the drive signals, a current signal corresponding to the amount of charges generated by the photoelectric conversion unit is output from the pixel. The current signal from the pixel is input to the A-D convertor via the current mirror circuit. The A-D convertor converts the current signal, which output from the pixel as an analog signal, into a digital signal. According to drive signals the horizontal scanning circuit provides, the digital signal is read out to the output portion. The output portion outputs the digital signal to the outside of the device.

The present embodiment may differ from the above described embodiments in that the impedance conversion portion is the common gate amplifier. The other features may be the same as the above described embodiments. The detailed explanation of the same features as the above described embodiments is not repeated.

An exemplary structure of the pixel may be the same as the above described embodiment. The equivalent circuit of the pixel is illustrated in FIG. 14. The exemplary planar and cross-sectional structures of the pixel is illustrated in FIGS. 8, 9 and 10. The detailed explanation is not repeated.

In the present embodiment, the first output line 104 is electrically connected to the common gate amplifier. The common gate amplifier includes an N-type channel MOS transistor 1701. The gate of the transistor 1701 may be provided with a bias voltage VGATE. The drain of the transistor 1701 is electrically connected to a node 1705.

A source current and a drain current of the transistor 1701 may have the substantially same amplitudes. In other words, the current signal from the pixel may be transmitted to the node 1705 via the common gate amplifier. The change in voltage according to the change of the current signal may be smaller at the drain (the node 1705) of the transistor 1701 than at the source. Accordingly, the change in voltage at the first output line 104, which may have a large parasitic capacitance, may be reduced. In another aspect of view, since the common gate amplifier may convert the impedance, the capacitance of the node 1705 may be smaller than that of the first output line 104.

As illustrated in FIG. 17, the comparator is provided to each of the pixel columns. The comparator includes a current mirror circuit includes P-type channel MOS transistors. The node 1705 is a first input node of the comparator. The first input node is electrically connected to the common gate amplifier. A second input node of the comparator is electrically connected to the ramp current signal source 1704. The node 1705 may be an output node, where a signal representing a result of the comparison may be output.

The output node of the comparator is electrically connected to a common source amplifier. The common source amplifier includes a P-type channel MOS transistor and a current source which serves as a load. The output node of the common source amplifier is electrically connected to the latch pulse generator 113. The common source amplifier may inversely amplify the signal representing a result of the comparison, which is output from the comparator, and transmit the amplified signal to the latch pulse generator 113. In the present embodiment, the signal representing a result of the comparison may be a current signal, and, the common source amplifier may convert the current signal into the voltage signal.

The node 1705 is electrically connected to a clip circuit, which is provided in order to keep the transistor 1701 from turning off. The clip circuit includes an N-type channel MOS transistor 1703. The gate of the transistor 1703 may provided with a clip voltage VCLIP.

Figure 18:
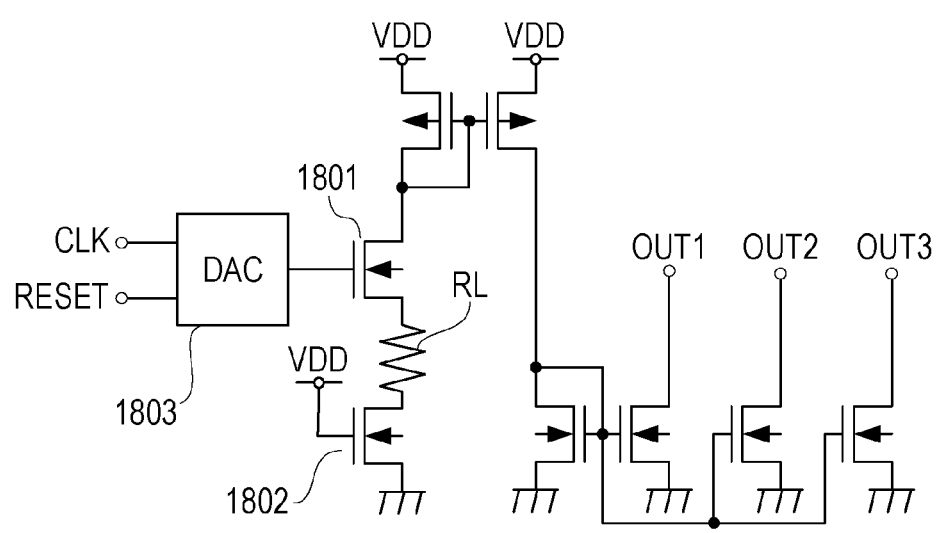
FIG. 18 illustrates an equivalent circuit of an exemplary ramp current signal source of an exemplary embodiment.

Hereinafter, an exemplary structure of the ramp current signal source 1704 will be described in detail. FIG. 18 illustrates an equivalent circuit of the ramp current signal source 1704 of the present embodiment. The ramp current signal source 1704 may include a current output circuit, a first current mirror circuit and a second current mirror circuit. The current output circuit may output a current corresponding to an input voltage. The second current mirror circuit may dispense the current from the current output circuit to a plurality of the comparators 108.

The current output circuit included in the ramp current signal source 1704 of the present embodiment may be a common source amplifier. The common source amplifier of the ramp current signal source 1704 may include an amplification transistor 1801 and a load resistor RL. The source of the amplification transistor 1801 is electrically connected to the load resistor RL. The drain of the amplification transistor 1801 is electrically connected to the first current mirror circuit.

The load resistor RL is electrically connected to a drain of a load transistor 1802. The source of the load transistor 1802 is electrically connected to the ground voltage line. The gate of the load transistor 1802 may be provided with the power source voltage VDD. The load transistor 1802 may correspond to the selection transistor 1405 of the pixel 1301. The load transistor 1802 may be arranged such that the pixel and the ramp current signal source 1704 may have the same or similar structures.

The gate of the amplification transistor 1801 is electrically connected to a DAC (Digital to Analog Convertor) 1803. The function of the DAC 1803 may be the same as the DAC 504 in the above described embodiments. The detailed description of the DAC 1503 is not repeated.

The drain current of the amplification transistor 1801 may vary on the basis of the voltage signal the DAC 1803 outputs. The drain current of the amplification transistor 1801 may be the ramp current signal.

The drain current of the amplification transistor 1801 may be mirrored by the first and second current mirror circuits of the ramp current signal source 1704 and input to the plurality of the comparators 108. An OUT1 node is electrically connected to the reference current input node of the comparator provided for the leftward column in FIG. 17. An OUT2 node is electrically connected to the reference current input node of the comparator provided for the middle column in FIG. 17. An OUT3 node is electrically connected to the reference current input node of the comparator provided for the rightward column in FIG. 17. The number of output-side transistors of the current mirror circuit of the ramp current signal source 1704 may correspond to the number of the comparators. In another case, the ramp current signal source 1704 may be provided for each of the plurality of the comparators. In this case, the current mirror circuit for dispensing the ramp current signals may be omitted.

The current output circuit included in the ramp current signal source 1704 may have the same structure as, or a similar structure to the pixel amplification unit. In the present embodiment, the same common source amplifier is used for the ramp current signal source 1704. Further, the ramp current signal source 1704 may include a dummy transistor, which may correspond to the pixel transistor such as the reset transistor or the transfer transistor. In detail, the ramp current signal source 1704 may be a circuit which substitutes the DAC 1803 for the PD 1401 of the circuit illustrated in FIG. 14. In the case where the current output circuit included in the ramp current signal source 1302 has the same structure as, or a similar structure to the pixel amplification unit, linearity in analog to digital conversion may be improved.

The current mirror circuit in the comparator in FIG. 17 and the second current mirror circuit of the ramp current signal source 1704 in FIG. 18 may be omitted. In this case, a plurality of the first current mirror circuits are provided so as to dispense the ramp current signal to the plurality of the pixel rows. In another case, the ramp current signal source 1704 may be replaced by the ramp current signal source 109 of the above embodiments.

An exemplary operation for the photoelectric conversion device according to the present embodiment may be the same as the above described embodiments. The photoelectric conversion device may be operated according to the drive signals illustrated in FIG. 11 or 16.

In the present embodiment, the current signal from the pixel is input to the comparator via an impedance conversion portion, and then compared with the ramp current signal. Since the parasitic capacitance of the output node may be reduced, the voltage of the output node may be quickly inverted. As a result, the above mentioned error may be reduced when a clock signal of a high frequency is used. Hence, speed of the analog to digital conversion may be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2011-274890 filed Dec. 15, 2011, and No. 2012-205581 filed Sep. 19, 2012, which are hereby incorporated by reference herein in its entirety.

What is claimed is:

1. An image pickup device comprising:
   a first output line for current signals from a plurality of pixels being output to the first output line;
   a current mirror circuit including a first transistor electrically connected to the first output line and a second transistor electrically connected to a second output line, the current mirror circuit being configured to mirror the current signals from the plurality of pixels into the second output line, the first transistor being configured to receive the current signals from the first output line, and the second transistor being configured to output a mirrored current signal to the second output line; and
   a comparator configured to compare the mirrored current signal being output from the current mirror circuit to the second output line with a reference current signal, and to output a signal representing a comparison result of amplitudes of the mirrored current signal and the reference current signal,
   wherein each of the plurality of the pixels includes a photoelectric conversion unit and an amplification unit configured to output, to the first output line, one of the current signals from the plurality of pixels, and
   wherein each of the current signals from the plurality of pixels is based on an amount of charges generated by the photoelectric conversion unit.

2. The image pickup device according to claim 1, further comprising an analog to digital convertor configured to convert the mirrored current signal into a digital signal, based on the signal representing the comparison result output from the comparator.

3. The image pickup device according to claim 2, further comprising a ramp current signal source configured to output a ramp current signal,
   wherein the ramp current signal is the reference signal to be input to the comparator.

4. The image pickup device according to claim 3, wherein at least one transistor included in the amplification unit and elements connected thereto form the same circuitry structure as at least one transistor included in the ramp current signal source and elements connected thereto form.

5. The image pickup device according to claim 1, wherein the current mirror circuit includes a gain control unit configured to control an amplification factor of the mirrored current signal to the current signal from the pixel.

6. The image pickup device according to claim 5,
wherein the current mirror circuit includes a plurality of output-side transistors arranged in parallel on an output side of the current mirror circuit, and
wherein the gain control unit is configured to change a number of the output-side transistors being connected, thereby controlling the amplification factor.

7. The image pickup device according to claim 6,
wherein the gain control unit includes a plurality of gain control switches corresponding to the plurality of the output-side transistors.

8. The image pickup device according to claim 5, wherein the gain control unit is configured to control the amplification factor for one of the plurality of the pixels individually outputting the current signal.

9. The image pickup device according to claim 5, wherein the gain control unit is configured to control the amplification factor to be a first value for one of the plurality of the pixels individually outputting the current signal, and to control the amplification factor to be a second value, smaller than the first value, for two or more of the plurality of the pixels simultaneously outputting the current signals.

10. The image pickup device according to claim 1,
wherein the plurality of the pixels are configured to simultaneously output current signals from two or more of the pixels to the first output line, and
wherein the first output line is configured such that the current signals simultaneously output to the first output line are summed up at the first output line.

11. The image pickup device according to claim 10, further comprising a bias current source configured to provide each of the plurality of the pixels with a bias current,
wherein the bias current source is configured to provide a first bias current for one of the plurality of the pixels individually outputting the current signal, and to provide a second bias current, having a larger amplitude than that of the first bias current, for two or more of the plurality of the pixels simultaneously outputting the current signals.

12. The image pickup device according to claim 1, wherein only one or more transistors for outputting the mirrored current signal and one or more transistors for outputting the reference current signal are electrically connected to an output node of the comparator, the signal representing the comparison result being output to the output node.

13. The image pickup device according to claim 1, wherein a number of transistors connected to the first output line is larger than a number of transistors connected to an output node of the comparator, the signal representing the comparison result being output to the output node.

14. The image pickup device according to claim 1, further comprising a first semiconductor substrate,
wherein the photoelectric conversion unit is provided in the first semiconductor substrate,
wherein the first output line is provided on a first surface of the first semiconductor substrate, and
wherein the photoelectric conversion unit is configured to convert incident light from a second surface of the first semiconductor substrate, opposite to the first surface, into a charge.

15. The image pickup device according to claim 14, further comprising a second semiconductor substrate facing to the first surface of the first semiconductor substrate,
wherein the first output line is provided between the first and second semiconductor substrates, and
wherein either one of or both of the current mirror circuit and the amplification unit is/are provided in the second semiconductor substrate.

16. An image pickup device comprising:
an output line;
a plurality of pixels, each of the plurality of the pixels including a photoelectric conversion unit and an amplification unit configured to output, to the output line, a current signal based on an amount of charges generated by the photoelectric conversion unit;
a current mirror circuit electrically connected to the output line;
a ramp current signal source configured to output a ramp current signal;
a comparator configured to compare a mirrored current signal from the current mirror circuit with the ramp current signal, and to output a signal representing a comparison result of amplitudes of the mirrored current signal and the ramp current signal;
an analog to digital convertor configured to convert the mirrored current signal into a digital signal, based on the signal representing the comparison result output from the comparator; and
a bias current source configured to provide each of the plurality of pixels with a bias current,
wherein the current mirror circuit includes a gain control unit configured to control an amplification factor of the mirrored current signal to the current signal from the pixel,
wherein the gain control unit is configured to control the amplification factor to be a first value for one of the plurality of the pixels individually outputting the current signal, and to control the amplification factor to be a second value, smaller than the first value, for two or more of the plurality of the pixels simultaneously outputting the current signals,
wherein the bias current source is configured to provide a first bias current for one of the plurality of the pixels individually outputting the current signal, and to provide a second bias current, having a larger amplitude than that of the first bias current, for two or more of the plurality of the pixels simultaneously outputting the current signals, and
wherein a number of the pixels electrically connected to the output line is larger than a number of transistors connected to an output node of the comparator, the signal representing the comparison result being output to the output node.

17. An image pickup device comprising:
a plurality of the pixels;
an output line for current signals from the plurality of pixels being output to the output line;
a current mirror circuit electrically connected to the output line; and
a comparator configured to compare a mirrored current signal from the current mirror circuit with a reference current signal, and to output a signal representing a comparison result of amplitudes of the mirrored current signal and the reference current signal,
wherein each of the plurality of the pixels includes a photoelectric conversion unit and an amplification unit configured to output, to the output line, one of the current signals from the plurality of pixels, wherein each of the current signals from the plurality of pixels is based on an amount of charges generated by the photoelectric conversion unit, wherein the current mirror circuit includes a gain control unit configured to control an amplification factor of the mirrored current signal to the current signal from the pixel, and wherein the gain control unit is configured to control the amplification factor to be a first value for one of the plurality of the pixels individually outputting the current signal, and to control the amplification factor to be a second value, smaller than the first value, for two or more of the plurality of the pixels simultaneously outputting the current signals.

18. An image pickup device comprising:
a plurality of pixels;
an output line for current signals from the plurality of pixels being output to the output line;
a current mirror circuit electrically connected to the output line; and
a comparator configured to compare a mirrored current signal from the current mirror circuit with a reference current signal, and to output a signal representing a comparison result of amplitudes of the mirrored current signal and the reference current signal, wherein each of the plurality of the pixels includes a photoelectric conversion unit and an amplification unit configured to output, to the output line, one of the current signals from the plurality of pixels, wherein each of the current signals from the plurality of pixels is based on an amount of charges generated by the photoelectric conversion unit, wherein the plurality of the pixels are configured to simultaneously output current signals from two or more of the signal pixels to the output line, wherein the output line is configured such that the current signals simultaneously output to the output line are summed up at the output line, wherein the image pickup device further comprises a bias current source configured to provide each of the plurality of the pixels with a bias current, and wherein the bias current source is configured to provide a first bias current for one of the plurality of the pixels individually outputting the current signal, and to provide a second bias current, having a larger amplitude than that of the first bias current, for two or more of the plurality of the pixels simultaneously outputting the current signals.

19. An image pickup device comprising:
a plurality of pixels;
an output line for current signals from the plurality of pixels being output to the output line;
a current mirror circuit electrically connected to the output line;
a comparator configured to compare a mirrored current signal from the current mirror circuit with a reference current signal, and to output a signal representing a comparison result of amplitudes of the mirrored current signal and the reference current signal;
a first semiconductor substrate; and
a second semiconductor substrate facing to a first surface of the first semiconductor substrate, wherein each of the plurality of the signal pixels includes a photoelectric conversion unit and an amplification unit configured to output, to the output line, one of the current signals from the plurality of pixels, wherein each of the current signals from the plurality of pixels is based on an amount of charges generated by the photoelectric conversion unit, wherein the photoelectric conversion unit is provided in the first semiconductor substrate, wherein the output line is provided on the first surface of the first semiconductor substrate, wherein the photoelectric conversion unit is configured to convert incident light from a second surface of the first semiconductor substrate, opposite to the first surface, into a charge, wherein the output line is provided between the first and second semiconductor substrates, and wherein either one of or both of the current mirror circuit and the amplification unit is/are provided in the second semiconductor substrate.

* * * * *